United States Patent
Miyazaki et al.

(10) Patent No.: US 12,119,076 B2
(45) Date of Patent: Oct. 15, 2024

(54) SEMICONDUCTOR INTEGRATED CIRCUIT

(71) Applicant: KIOXIA CORPORATION, Tokyo (JP)

(72) Inventors: Takayuki Miyazaki, Setagaya Tokyo (JP); Yuki Ishizaki, Odawara Kanagawa (JP)

(73) Assignee: Kioxia Corporation, Tokyo (JP)

( * ) Notice: Subject to any disclaimer, the term of this patent is extended or adjusted under 35 U.S.C. 154(b) by 280 days.

(21) Appl. No.: 17/679,924

(22) Filed: Feb. 24, 2022

(65) Prior Publication Data

US 2023/0010266 A1 Jan. 12, 2023

(30) Foreign Application Priority Data

Jul. 6, 2021 (JP) ................................ 2021-111946

(51) Int. Cl.
*G11C 7/06* (2006.01)
*G11C 7/10* (2006.01)
*G11C 7/12* (2006.01)

(52) U.S. Cl.
CPC ............ *G11C 7/065* (2013.01); *G11C 7/1006* (2013.01); *G11C 7/1057* (2013.01); *G11C 7/106* (2013.01); *G11C 7/12* (2013.01)

(58) Field of Classification Search
CPC .... G11C 7/065; G11C 7/12; G11C 2029/0411
See application file for complete search history.

(56) References Cited

U.S. PATENT DOCUMENTS

| | | | |
|---|---|---|---|
| 8,374,041 B2 * | 2/2013 | Komai | G11C 16/26 365/189.011 |
| 2012/0243360 A1 * | 9/2012 | Ferrant | G11C 11/4097 365/207 |
| 2013/0250684 A1 * | 9/2013 | Fujimura | G11C 16/06 365/185.06 |
| 2019/0050169 A1 * | 2/2019 | Komai | G11C 7/18 |
| 2020/0286529 A1 * | 9/2020 | Takagiwa | G11C 16/26 |

FOREIGN PATENT DOCUMENTS

JP  H08-221977 A  8/1996

* cited by examiner

*Primary Examiner* — Huan Hoang
*Assistant Examiner* — Justin Bryce Heisterkamp
(74) *Attorney, Agent, or Firm* — Kim & Stewart LLP

(57) ABSTRACT

A semiconductor integrated circuit includes a plurality of sense amplifier units including a first group of sense amplifier units and a second group of sense amplifier units, a first data bus, a second data bus, a transfer circuit between the first data bus and the second data bus, and a data latch connected to the second data bus and to the first data bus through the transfer circuit and the second data bus. Each sense amplifier unit is connected to one of the bit lines. The first data bus is connected to each of the sense amplifier units in the first group. The second data bus is connected to each of the sense amplifier units in the second group. The transfer circuit controls the transfer of data between the first data bus and the second data bus in both directions.

20 Claims, 20 Drawing Sheets

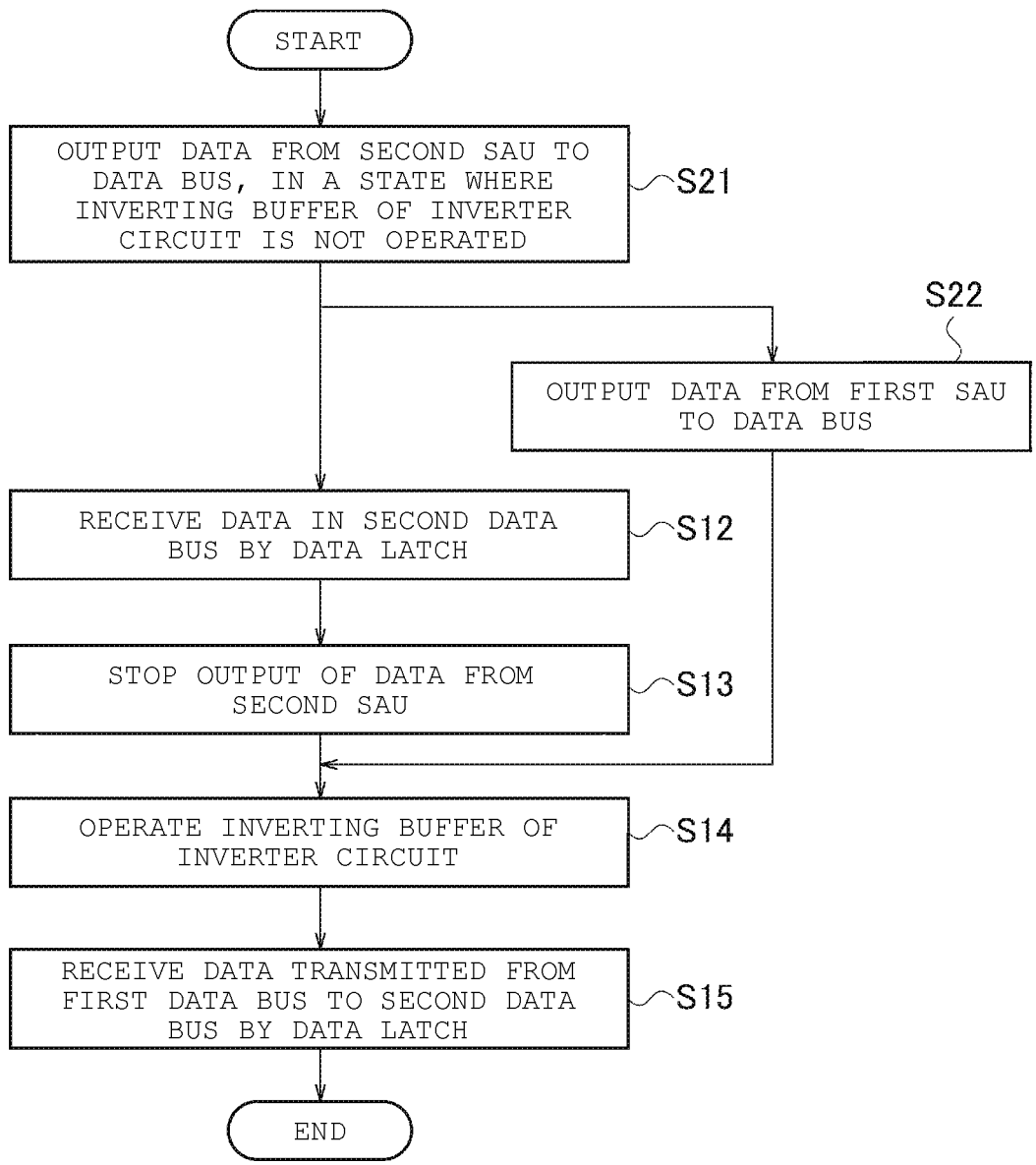

SEMICONDUCTOR INTEGRATED CIRCUIT

CROSS-REFERENCE TO RELATED APPLICATION

This application is based upon and claims the benefit of priority from Japanese Patent Application No. 2021-111946, filed Jul. 6, 2021, the entire contents of which are incorporated herein by reference.

FIELD

Embodiments described herein relate generally to a semiconductor integrated circuit.

BACKGROUND

A semiconductor integrated circuit has wirings such as a signal line through which data is transmitted and a power supply line for supplying power. Noise is generated in the wirings due to the capacitive coupling between the wirings.

DESCRIPTION OF THE DRAWINGS

FIG. 19 is a flowchart illustrating another operation example of the sense amplifier according to the embodiment.

DETAILED DESCRIPTION

Figure 1:
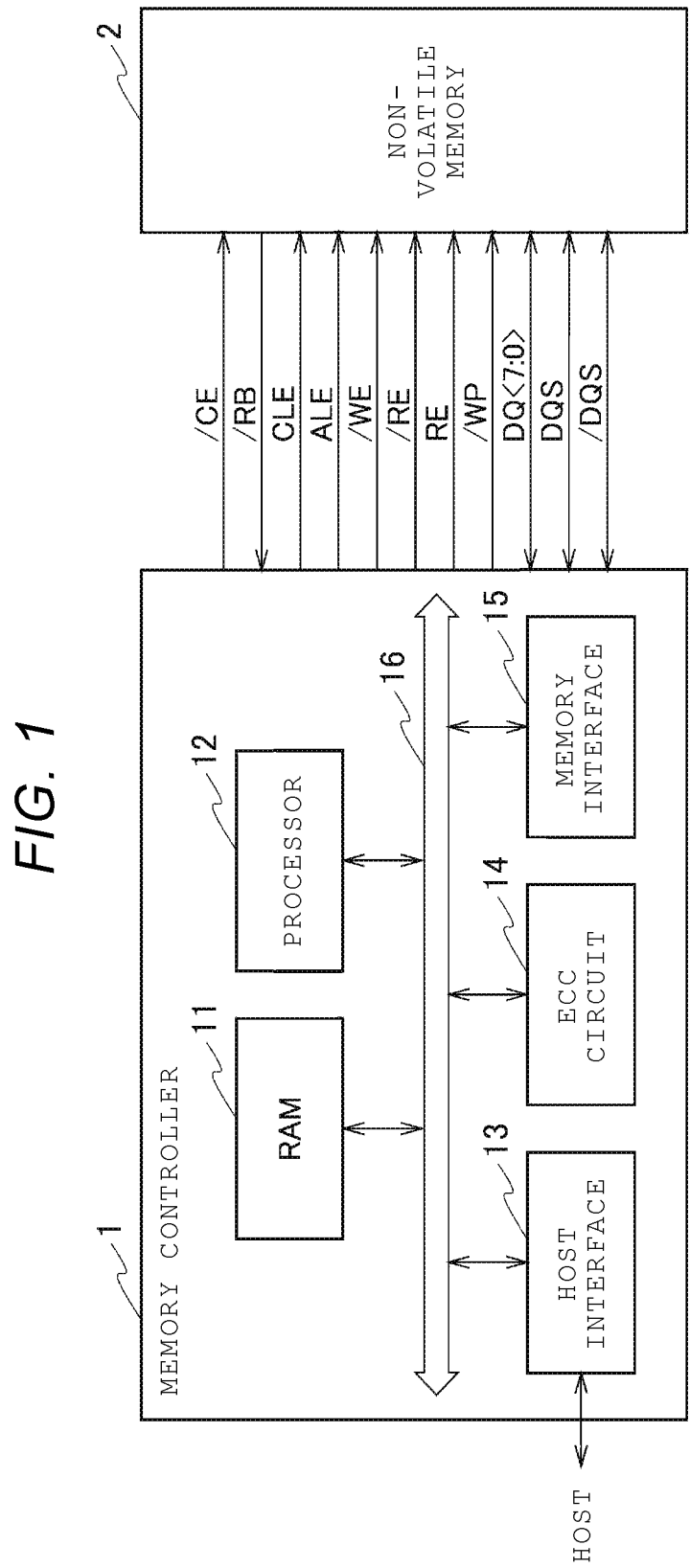
FIG. 1 is a block diagram showing a configuration of a memory system including a non-volatile memory having a semiconductor integrated circuit according to an embodiment.

Embodiments provide a semiconductor integrated circuit capable of reducing the influence of noise generated in wirings due to capacitive coupling between the wirings.

In general, according to one embodiment, a semiconductor integrated circuit includes a plurality of sense amplifier units including a first group of sense amplifier units and a second group of sense amplifier units, a first data bus, a second data bus, a transfer circuit between the first data bus and the second data bus, and a data latch connected to the second data bus and to the first data bus through the transfer circuit and the second data bus. Each sense amplifier unit is connected to one of the bit lines. The first data bus is connected to each of the sense amplifier units provided in the first group. The second data bus is connected to each of the sense amplifier units provided in the second group. The transfer circuit controls the transfer of data between the first data bus and the second data bus in both directions.

Next, an embodiment will be described with reference to the drawings. In the description of the drawings described below, the same or similar parts are designated by the same or similar reference numerals. The drawings are schematic. Further, the embodiment shown below illustrates devices and methods for embodying the technical idea, and is not intended to limit the scope of the present disclosure to the particular material, shape, structure, arrangement, or the like of the parts described herein. The embodiment may be modified in various ways.

The semiconductor integrated circuit according to the embodiment of the present disclosure is, for example, a non-volatile memory 2 in a memory system shown in FIG. 1. The non-volatile memory 2 is a semiconductor memory device that stores data in a non-volatile manner. The non-volatile memory 2 is, for example, a NAND flash memory. A memory controller 1 controls the operation of the non-volatile memory 2. A host is, for example, an electronic device such as a personal computer or a mobile terminal.

First, the memory system shown in FIG. 1 will be described. It is noted that, in the following description, a signal DQ<7:0> is a set of signals DQ<0>, DQ<1>, ..., and DQ<7>, each of which is a one-bit signal. The signal DQ<7:0> is an 8-bit signal.

The memory controller 1 receives an instruction from the host, and controls the non-volatile memory 2 based on the received instruction. Specifically, the memory controller 1 writes the data instructed to be written by the host to the non-volatile memory 2, reads the data instructed to be read by the host from the non-volatile memory 2, and transmits the read data to the host. A write target non-volatile memory cell of the non-volatile memory 2 is designated by the memory controller 1. Hereinafter, the non-volatile memory cell of the non-volatile memory 2 is also referred to as a "memory cell".

The memory controller 1 and the non-volatile memory 2 transmit and receive signals according to the interface standard between the memory controller 1 and the non-volatile memory 2 via individual signal lines. The signals transmitted and received between the memory controller 1 and the non-volatile memory 2 are signals /CE, /RB, CLE, ALE, /WE, /RE, RE, /WP, DQ<7:0>, DQS, /DQS, or the like.

The signal /CE is a chip enable signal for enabling the non-volatile memory 2. The signal /RB is a ready busy signal indicating whether the non-volatile memory 2 is in a ready state (a state capable of receiving an instruction from the outside) or a busy state (a state not capable of receiving an instruction from the outside). The signal CLE is a command latch enable signal that notifies the non-volatile memory 2 that the signal DQ<7:0> transmitted to the non-volatile memory 2 while the signal CLE is at the high (H) level contains a command. The signal ALE is an address latch enable signal that notifies the non-volatile memory 2 that the signal DQ<7:0> transmitted to the non-volatile memory 2 while the signal ALE is at H level contains an address.

The signal /WE is a write enable signal instructing the non-volatile memory 2 to receive the signal DQ<7:0> transmitted to the non-volatile memory 2. The signal /WE instructs the non-volatile memory 2 to receive the signal DQ<7:0> as a command, an address or data transmitted to the non-volatile memory 2 at the rising edge of the signal /WE, in the single data rate (SDR) mode. The signal /WE instructs the non-volatile memory 2 to receive the signal DQ<7:0> as a command or an address transmitted to the non-volatile memory 2 at the rising edge of the signal /WE, in the double data rate (DDR) mode. The signal /WE is asserted by the memory controller 1 each time the non-volatile memory 2 receives a command, address, and data.

The signal /RE is a read enable signal instructing the memory controller 1 to output the signal DQ<7:0> from the non-volatile memory 2. The signal RE is a complementary signal of the signal /RE. For example, the signals /RE and RE are used to control the operation timing of outputting the signal DQ<7:0> by the non-volatile memory 2. More specifically, the signals /RE and RE instruct the non-volatile memory 2 to output the signal DQ<7:0> as data to the non-volatile memory 2 at the falling edge of the signal /RE, in the single data rate mode. Further, the signals /RE and RE instruct the non-volatile memory 2 to output the signal DQ<7:0> as data to the non-volatile memory 2 at the falling edge and the rising edge of the signal /RE, in the double data rate mode.

The signal /WP is a write-protect signal that instructs the non-volatile memory 2 to prohibit writing of data. The signal DQ<7:0> contains data transmitted and received between the non-volatile memory 2 and the memory controller 1, and includes a command CMD, an address ADD, and a data DAT. The data DAT includes write data and read data. The signal DQS is a data strobe signal used to control the operation timing of the non-volatile memory 2 according to the signal DQ<7:0>. The signal /DQS is a complementary signal of the signal DQS. The signals DQS and /DQS are generated based on, for example, the signals RE and /RE. More specifically, in the double data rate mode, the non-volatile memory 2 is instructed to receive the signal DQ<7:0> as data at the falling edge and the rising edge of the signal DQS. Further, the signal DQS is generated based on the falling edge and the rising edge of the signal /RE in the double data rate mode, and is output from the non-volatile memory 2 together with the signal DQ<7:0>.

The memory controller 1 includes a RAM 11, a processor 12, a host interface 13, an ECC circuit 14, and a memory interface 15. The RAM 11, the processor 12, the host interface 13, the ECC circuit 14, and the memory interface 15 are connected to each other via a bus 16.

The RAM 11 temporarily stores the data received from the host before being stored in the non-volatile memory 2, or temporarily stores the data read from the non-volatile memory 2 before being transmitted to the host. The RAM 11 is, for example, a general-purpose semiconductor memory such as a static random access memory (SRAM) or a dynamic random access memory (DRAM).

The processor 12 controls the operation of the entire memory controller 1. The processor 12 is, for example, a Central Processing Unit (CPU), a Micro Processing Unit (MPU), or the like. The processor 12 issues a read instruction to the non-volatile memory 2 in response to, for example, a data read instruction received from the host, and a write instruction to the non-volatile memory 2 in response to, for example, a data write instruction from the host. The processor 12 determines the storage area (memory area) of the non-volatile memory 2 with respect to the data stored in the RAM 11. Further, the processor 12 has a function of executing various operations on the read data from the non-volatile memory 2.

The host interface 13 is connected to the host, and executes processing according to the standard of the interface with the host. The host interface 13 transfers, for example, instructions and data received from the host, to the processor 12. Further, the host interface 13 transmits data read from the non-volatile memory 2, a response from the processor 12, and the like to the host.

The ECC circuit 14 encodes the data stored in the RAM 11 to generate a codeword. Further, the ECC circuit 14 decodes the codeword read from the non-volatile memory 2.

The memory interface 15 is connected to the non-volatile memory 2 via a bus and executes communication with the non-volatile memory 2. The memory interface 15 transmits the command CMD, the address ADD, and the write data to the non-volatile memory 2, in response to the instruction of the processor 12. Further, the memory interface 15 receives the read data from the non-volatile memory 2.

FIG. 1 shows a configuration example in which the memory controller 1 includes the ECC circuit 14 and the memory interface 15. However, the ECC circuit 14 may be integrated with the memory interface 15. Further, the ECC circuit 14 may be integrated with the non-volatile memory 2.

When a write instruction is received from the host, the memory system operates as follows. The processor 12 temporarily stores the data instructed to be written, in the RAM 11. The processor 12 reads the data stored in the RAM 11 and inputs the data to the ECC circuit 14. The ECC circuit 14 encodes the input data and inputs the codeword into the memory interface 15. The memory interface 15 writes the input codeword to the non-volatile memory 2.

When a read instruction is received from the host, the memory system operates as follows. The memory interface 15 inputs the codeword read from the non-volatile memory 2 into the ECC circuit 14. The ECC circuit 14 decodes the input codeword and stores the decoded data in the RAM 11. The processor 12 transmits the data stored in the RAM 11 to the host via the host interface 13.

Figure 2:
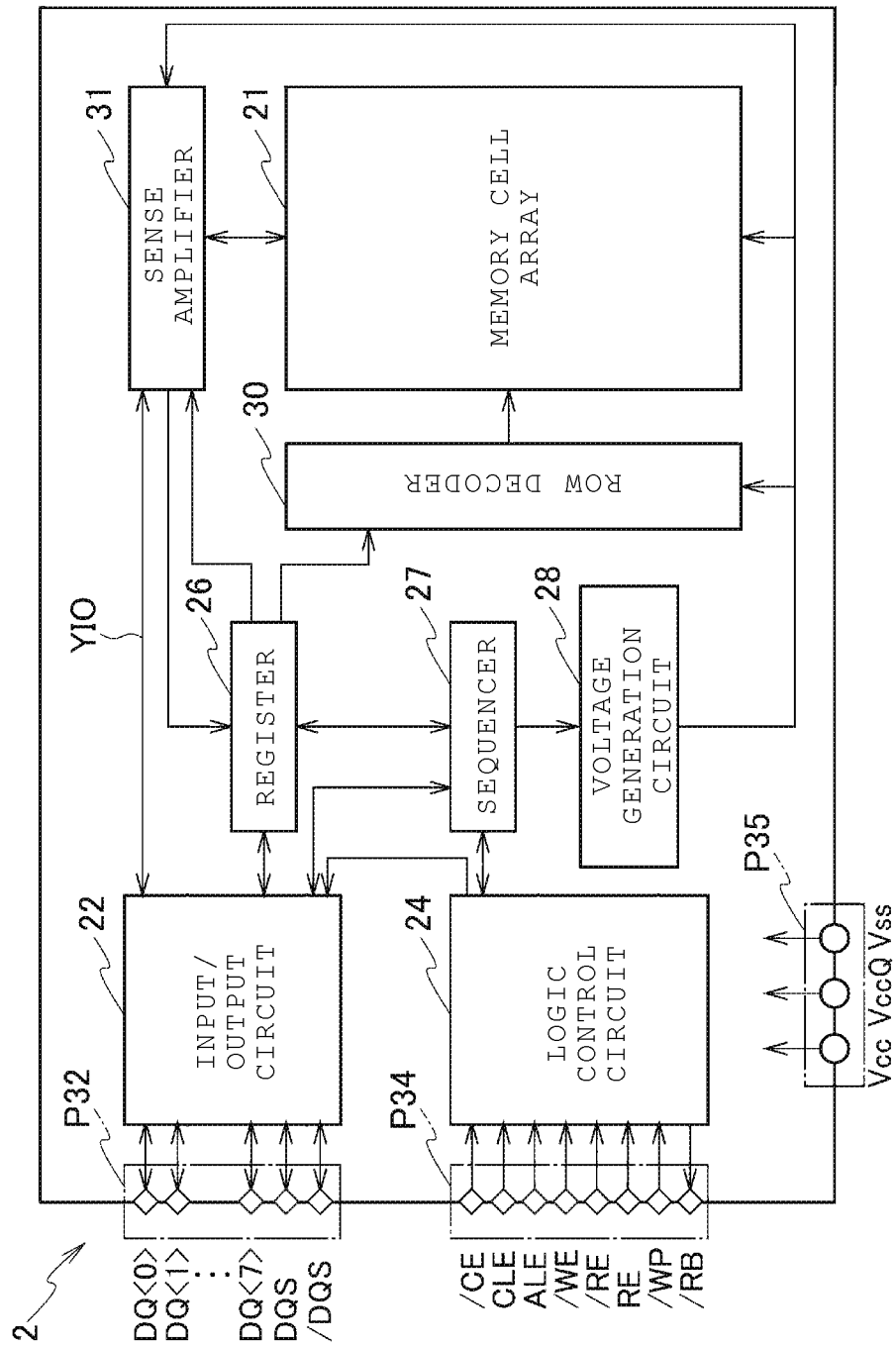
FIG. 2 is a block diagram showing a configuration of the non-volatile memory according to the embodiment.

FIG. 2 is a block diagram showing a configuration example of the non-volatile memory 2. The non-volatile memory 2 includes a memory cell array 21, an input/output circuit 22, a logic control circuit 24, a register 26, a sequencer 27, a voltage generation circuit 28, a row decoder 30, and a sense amplifier 31. Further, the non-volatile memory 2 includes an input/output pad group P32, a logic control pad group P34, and a power input terminal group P35.

The memory cell array 21 includes a plurality of memory cells (not shown) associated with word lines and bit lines.

The input/output circuit 22 transmits and receives signal DQ<7:0>, signal DQS, and signal /DQS to and from the memory controller 1. The input/output circuit 22 transfers the command CMD and the address ADD in the signal DQ<7:0> to the register 26. Further, the input/output circuit 22 transmits and receives write data and read data to and from the sense amplifier 31.

The logic control circuit 24 receives signals /CE, CLE, ALE, /WE, /RE, RE, /WP, and /RB from the memory controller 1. Further, the logic control circuit 24 transmits the signal /RB to the memory controller 1 to provide a notification of the state of the non-volatile memory 2 to the outside.

The register 26 stores the command CMD and address ADD. The register 26 transfers the address ADD to the row decoder 30 and the sense amplifier 31, and transfers the command CMD to the sequencer 27.

The sequencer 27 receives the command CMD, and controls the entire non-volatile memory 2 according to a sequence based on the received command CMD.

The voltage generation circuit 28 generates a voltage necessary for operations such as data writing, data reading, and data erasing, based on an instruction from the sequencer 27. Based on the address from the register 26, various voltages are supplied from the voltage generation circuit 28 to the row decoder 30, the sense amplifier 31, and the memory cell array 21.

The row decoder 30 receives the block address and the row address in the address ADD from the register 26. The row decoder 30 selects a block based on the block address and also selects a word line based on the row address.

During data reading, the sense amplifier 31 senses the read data read from the memory cell into the bit line, and transfers the sensed read data to the input/output circuit 22. During data writing, the sense amplifier 31 transfers the write data to the memory cell via the bit line.

Data transfer between the sense amplifier 31 and the input/output circuit 22 is performed via a data bus YIO. The data written into the non-volatile memory 2 and the data read from the non-volatile memory 2 are transmitted through the data bus YIO.

The input/output pad group P32 is provided with a plurality of terminals (pads) corresponding to the signal DQ<7:0> and the signals DQS and /DQS in order to transmit and receive each signal between the non-volatile memory 2 and the memory controller 1.

The logic control pad group P34 is provided with a plurality of terminals (pads) corresponding to the signals /CE, CLE, ALE, /WE, /RE, RE, /WP, and /RB in order to transmit and receive each signal between the non-volatile memory 2 and the memory controller 1.

The power input terminal group P35 is provided with a plurality of terminals to which the power supply voltages Vcc and VccQ, and the ground voltage Vss are input in order to supply various operating power supply voltages to the non-volatile memory 2 from the outside. The power supply voltage Vcc is a circuit power supply voltage generally applied from the outside as an operating power supply voltage. For example, the power supply voltage Vcc is 2.5 V. The power supply voltage VccQ is used when transmitting and receiving signals between the memory controller 1 and the non-volatile memory 2. For example, the power supply voltage VccQ is 1.2 V.

Figure 3A:
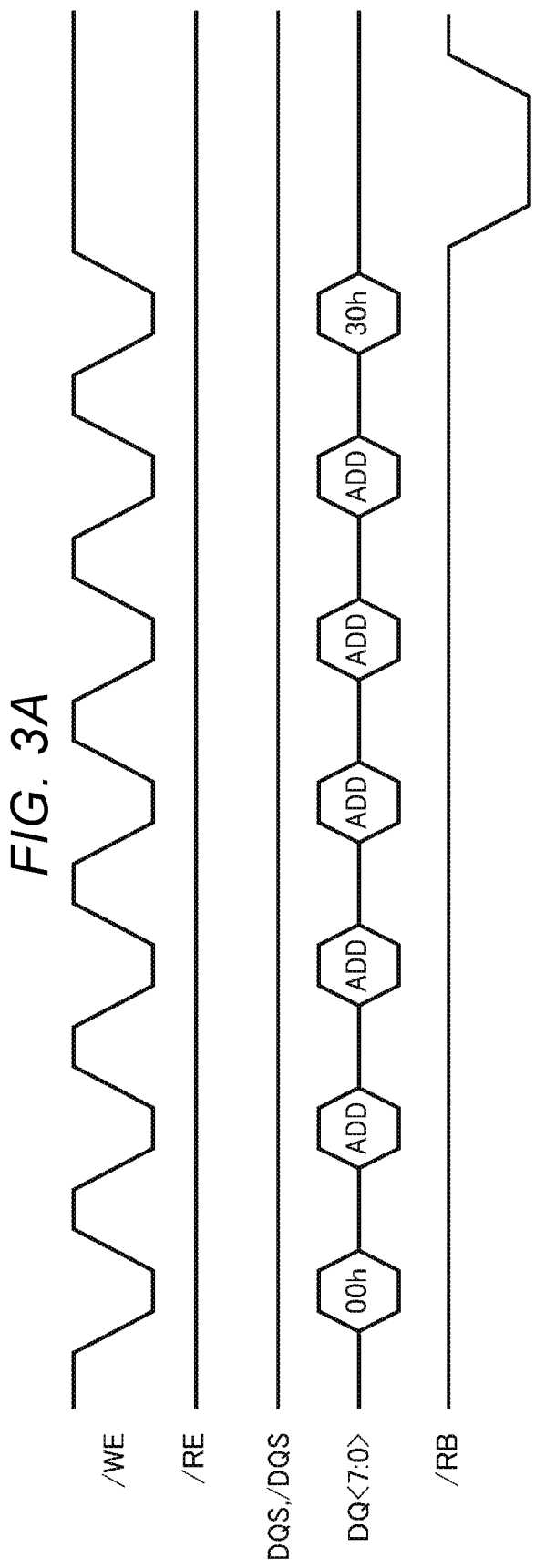
FIG. 3A is an example of a command sequence instructing a read operation of the non-volatile memory.
Figure 3B:
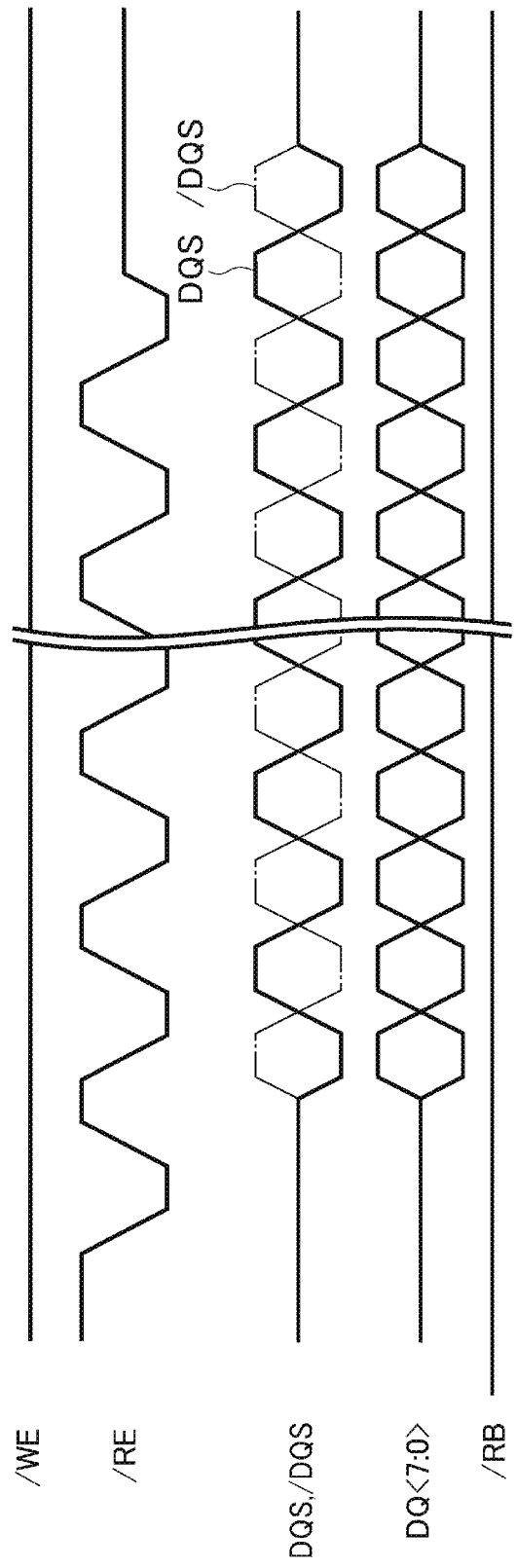
FIG. 3B is an example of a command sequence relating to a data read operation of the non-volatile memory.

FIG. 3A shows an example of a command sequence instructing a read operation of the non-volatile memory 2. FIG. 3B shows an example of a command sequence relating to a data read operation of the non-volatile memory 2.

As shown in FIG. 3A, during the read operation, the memory controller 1 continuously issues and transmits the read command "00h", the address ADD over 5 cycles, and the command "30h" to the non-volatile memory 2, while toggling the signal /WE. The read command "00h" is a command for instructing the reading of data from the memory cell array 21 of the non-volatile memory 2. The command "30h" is a command for instructing the start of the read operation. Upon receiving the command "30h", the non-volatile memory 2 starts the read operation of data from the memory cell array 21. At this time, the non-volatile memory 2 sets the signal /RB to the L level and informs the memory controller 1 that the non-volatile memory 2 is in a busy state. After the reading of the data from the memory cell array 21 is completed, the non-volatile memory 2 sets the signal /RB to the H level and informs the memory controller 1 that the non-volatile memory 2 is in the ready state.

After checking that the non-volatile memory 2 is in the ready state, the memory controller 1 toggles the signals /RE and RE as shown in FIG. 3B. The non-volatile memory 2 transfers the read data as the signal DQ<7:0> to the memory controller 1 in synchronization with the signals /RE and RE. Further, the non-volatile memory 2 toggles the signals DQS and /DQS in synchronization with the signal DQ<7:0> and transfers the signals to the memory controller 1.

Figure 4:
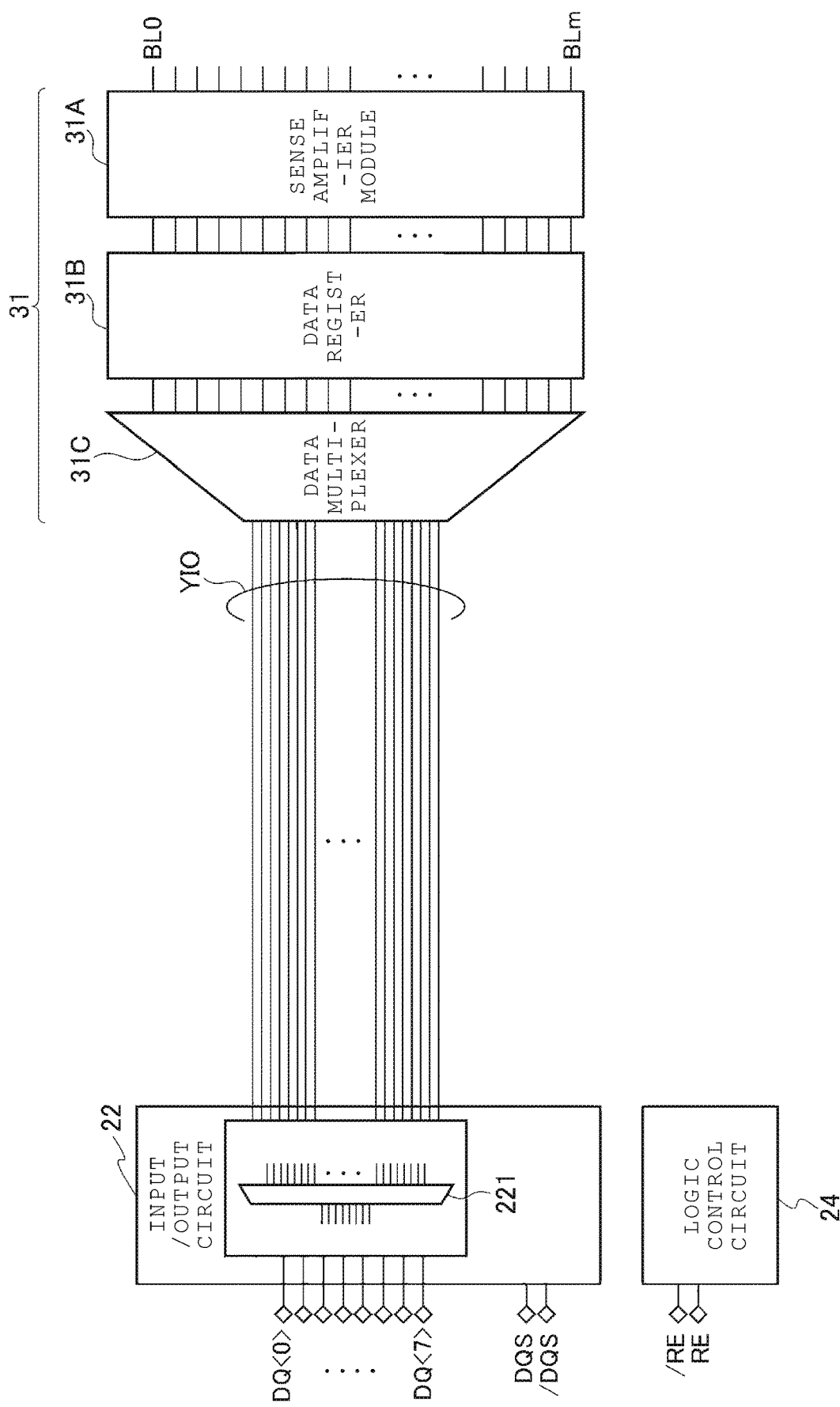
FIG. 4 is a block diagram showing a part of the configuration of the non-volatile memory according to the embodiment.

FIG. 4 is a block diagram showing a part of the configuration of the non-volatile memory 2 including the input/output circuit 22, the sense amplifier 31, and the data bus YIO. The input/output circuit 22 transmits and receives the write data and the read data to and from the sense amplifier 31 via the data bus YIO.

The sense amplifier 31 includes a sense amplifier module 31A connected to the bit lines BL0, . . . , and BLm, a data register 31B connected to the sense amplifier module 31A, and a data multiplexer 31C connected to the data register 31B (m is an integer of 1 or more). The number of bit lines is, for example, about 130,000. The sense amplifier module 31A senses the read data read on the bit line. Further, the sense amplifier module 31A transfers the write data to the memory cell via the bit line. The data register 31B stores the read data and the write data. The data multiplexer 31C selects data to transmit through the signal lines of the data bus YIO, from the data transmitted through the bit lines BL0, . . . , and BLm. The number of signal lines of the data bus YIO is, for example, 128.

The input/output circuit 22 may include a conversion circuit 221 that converts the bus width. The conversion circuit 221 converts, for example, the bus width of the data bus YIO including 128 bit lines into a bus including eight signal lines for the signal DQ<7:0>. The conversion circuit 221 may be, for example, a first in first out (FIFO) circuit. The power supply voltage Vcc (for example, 2.5 V) is applied between the sense amplifier 31 and the conversion circuit 221. The power supply voltage VccQ (for example, 1.2 V) is applied between the conversion circuit 221 and the memory controller 1.

The memory cell array 21 includes a plurality of blocks BLK0, ..., and BLKn (n is an integer of 1 or more). The block BLK is a set of nonvolatile memory cells, and is, for example, a unit for data erasing. Further, the memory cell array 21 is provided with a plurality of bit lines and a plurality of word lines, and each memory cell is associated with one bit line and one word line.

Figure 5:
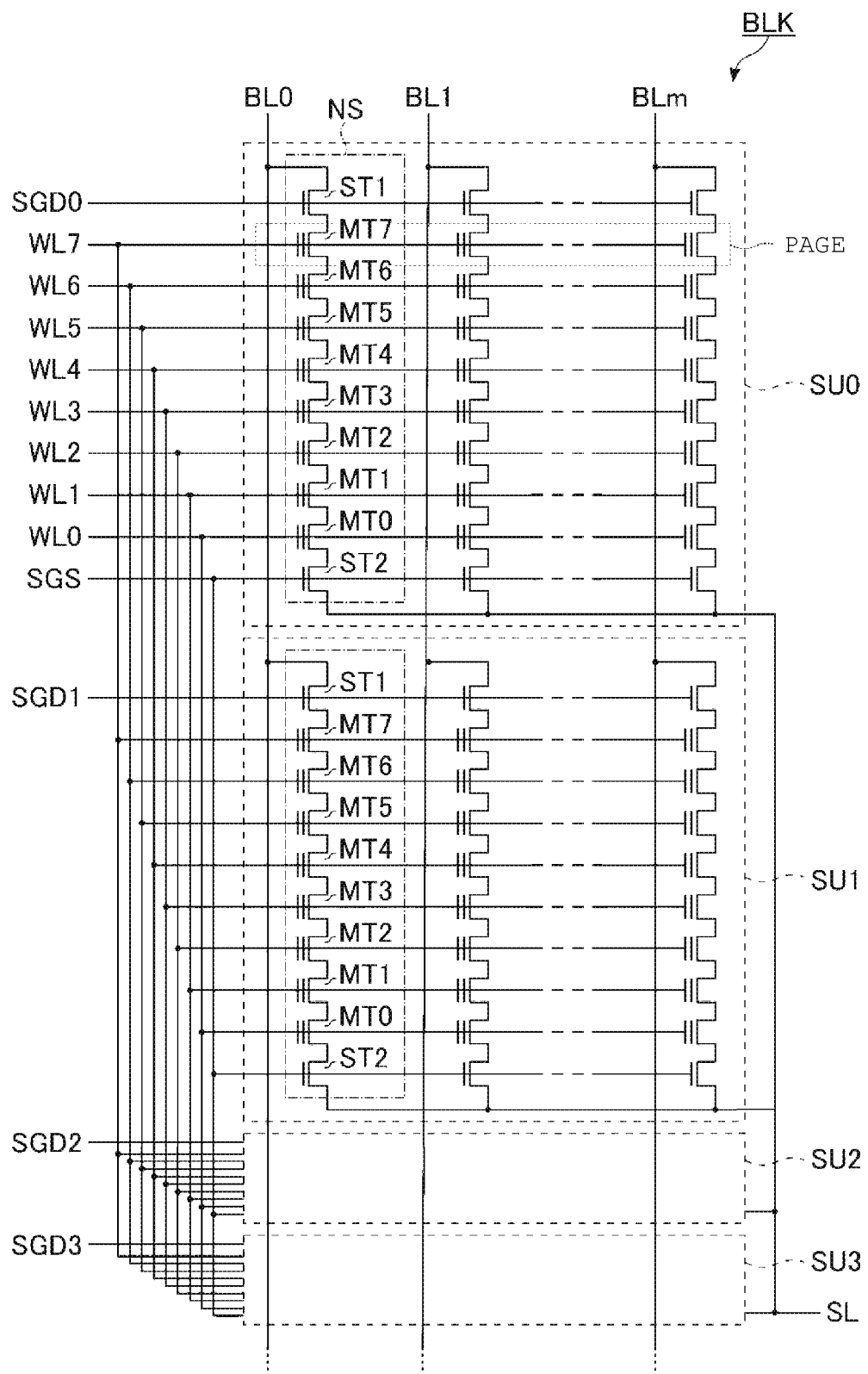
FIG. 5 is a circuit diagram showing a circuit configuration of a memory cell array.

FIG. 5 is a circuit diagram showing an example of the circuit configuration of the memory cell array 21. Hereinafter, the circuit configuration of the memory cell array 21 will be described with reference to one block BLK.

As shown in FIG. 5, the block BLK includes, for example, four string units SU0 to SU3. Hereinafter, the string units SU0 to SU3 are also referred to as "string unit SU". Each string unit SU includes a plurality of NAND strings NS associated with bit lines BL0, ..., and BLm, respectively. For example, the NAND string NS includes eight memory cells MT0 to MT7 and select transistors ST1 and ST2. Hereinafter, the memory cell in the NAND string NS is also referred to as "memory cell MT".

The memory cell MT includes a control gate and a charge storage layer, and stores data in a non-volatile manner. The memory cells MT0 to MT7 in the NAND string NS are connected in series between the source of the select transistor ST1 and the drain of the select transistor ST2. The control gates of the memory cells MT0 to MT7 in the same block BLK are commonly connected to the word lines WL0 to WL7, respectively.

The select transistor ST1 and the select transistor ST2 are used to select the string unit SU during various operations of the memory cell array 21. The gates of the select transistors ST1 in the string units SU0 to SU3 in the same block BLK are commonly connected to the select gate lines SGD0 to SGD3, respectively. The drains of the select transistors ST1 corresponding to the same row in each block BLK are commonly connected to the corresponding bit lines BL. The gates of the select transistors ST2 in the same block BLK are commonly connected to the select gate line SGS. The source of the select transistor ST2 in each block BLK is commonly connected to the source line SL across the plurality of blocks BLK.

In the following description, a plurality of memory cells MT connected to a common word line WL in one string unit SU will be referred to as a cell unit CU. The amount of data to be stored in the cell unit CU changes depending on the number of bits of data stored in each memory cell MT of the cell unit CU.

For example, when each of the memory cells MT stores one-bit data, one cell unit CU can store one-page data. Further, when each of the memory cells MT stores two-bit data, one cell unit CU can store two-page data. That is, the "one-page data" is defined by, for example, the total amount of data stored in the cell unit CU when each of the memory cells MT in one cell unit CU stores one-bit data.

Figure 6:
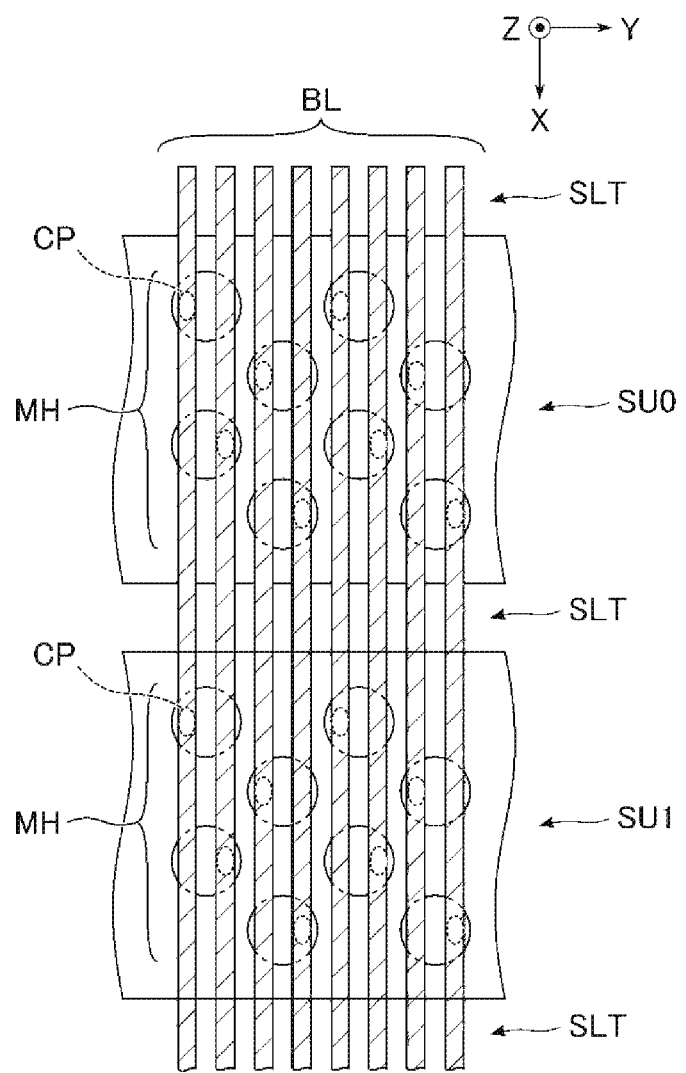
FIG. 6 is a schematic plan view showing a layout of the memory cell array.

FIG. 6 shows an example of the planar layout of the memory cell array 21. It is noted that, in the drawings used in the following description, an X-axis corresponds to the extending direction of the bit line BL, a Y-axis corresponds to the extending direction of the word line WL, and a Z-axis corresponds to the vertical direction with respect to the surface of the semiconductor substrate. For example, in the block BLK, the structures corresponding to each of the string units SU extend in the Y direction and the string units SU are arranged in the X direction.

For example, a slit SLT is provided between adjacent string units SU. In other words, the plurality of slits SLT each extend in the Y direction and are arranged in the X direction. In FIG. 6, one string unit SU is provided between the slits SLT. Alternatively, a plurality of string units SU may be provided between the slits SLT.

As shown in FIG. 6, each of the plurality of bit lines BL arranged in the Y direction is connected to one memory pillar MH for each string unit SU. Each of the memory pillars MH functions as, for example, one NAND string NS.

Specifically, in each string unit SU, for example, two bit lines BL overlap each memory pillar MH. One bit line BL of the two overlapping bit lines BL is connected to the corresponding memory pillar MH via a contact plug CP.

Figure 7:
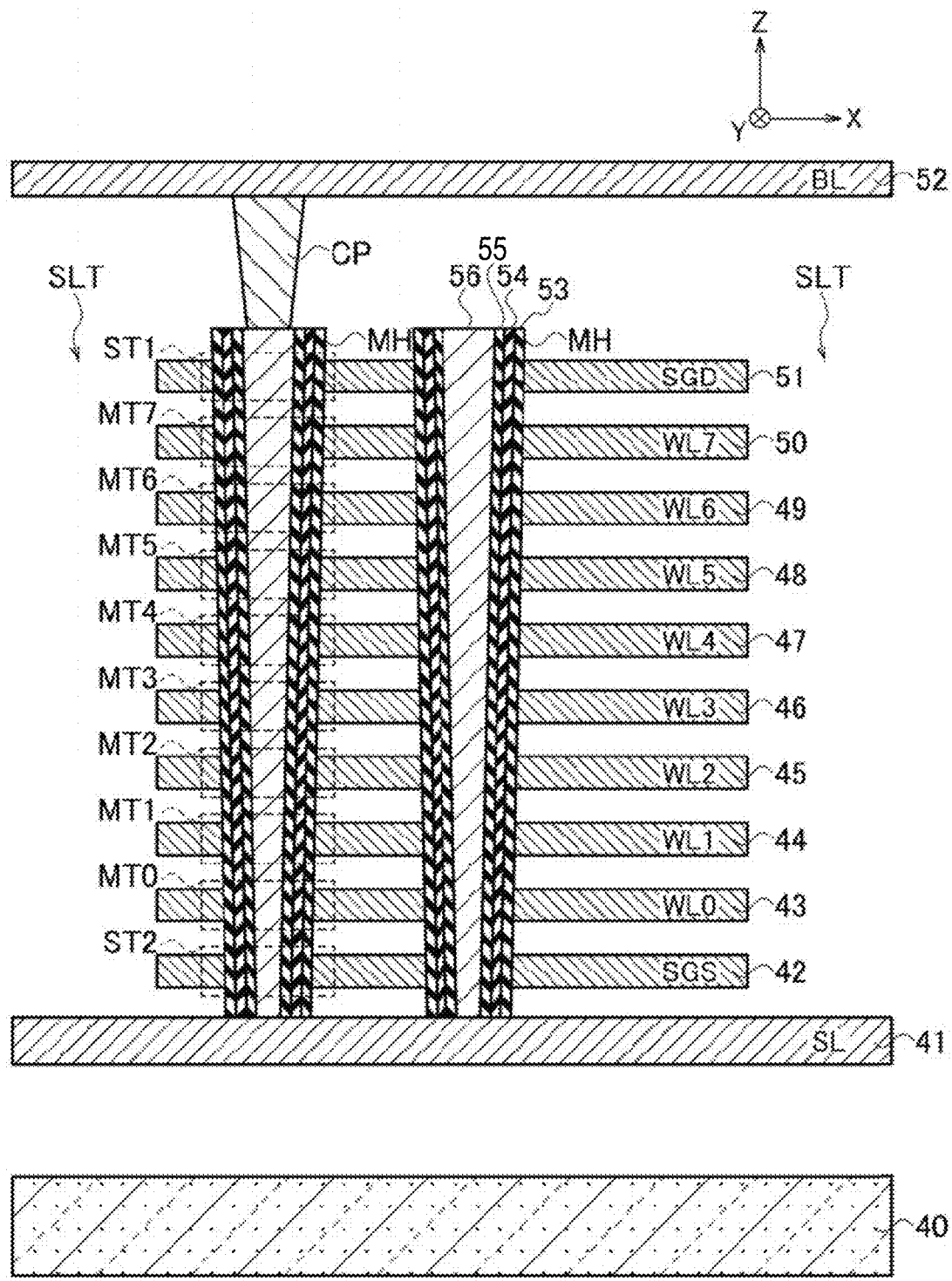
FIG. 7 is a schematic cross-sectional view showing a cross section of the memory cell array.

FIG. 7 shows an example of the cross-sectional structure of the memory cell array 21. It is noted that, in the cross-sectional view used in the following description, an interlayer insulating film is appropriately omitted.

As shown in FIG. 7, the memory cell array 21 includes, for example, a semiconductor substrate 40, conductors 41 to 52, the memory pillar MH, and the contact plug CP.

A conductor 41 is provided above the semiconductor substrate 40 via an interlayer insulating film (not shown). The conductor 41 is formed in a plate shape parallel to the XY plane, and corresponds to, for example, the source line SL.

Conductors 42 to 51 are provided above the conductor 41 and arranged in ascending order in the Z direction from the semiconductor substrate 40 side, for example, for each string unit SU. Among these conductors, the conductors adjacent to each other in the Z direction are stacked via an interlayer insulating film (not shown). Each of the conductors 42 to 51 is formed in a plate shape parallel to the XY plane. For example, the conductor 42 corresponds to the select gate line SGS, the conductors 43 to 50 correspond to the word lines WL0 to WL7, respectively, and the conductor 51 corresponds to the select gate line SGD.

The string unit SU is separated in the X direction by a plurality of slits SLT provided parallel to the YZ plane. The slit SLT extends from at least the conductor 51 to the top of the conductor 41. For example, the structure on the conductor 41 and between the adjacent slits SLT corresponds to one string unit SU.

The memory pillar MH is provided in a columnar shape that passes through (penetrates) each of the conductors 42 to 51, and is in contact with the conductor 41. Further, the memory pillar MH includes, for example, a block insulating film 53, an insulating film 54, a tunnel oxide film 55, and a semiconductor material 56.

The block insulating film 53 is provided on the inner wall of a memory hole formed during the manufacturing process of the non-volatile memory 2. The insulating film 54 is provided on the inner wall of the block insulating film 53. The insulating film 54 functions as a charge storage layer of the memory cell MT. The tunnel oxide film 55 is provided on the inner wall of the insulating film 54. The semiconductor material 56 is provided on the inner wall of the tunnel oxide film 55. The semiconductor material 56 is conductive and functions as a current path for the NAND string NS. Other materials may be formed in the interior side of the semiconductor material 56.

The portion where the memory pillar MH and the conductor 42 described above intersect each other functions as the select transistor ST2. The portions where the memory pillar MH and the conductors 43 to 50 intersect each other function as memory cells MT0 to MT7, respectively. The portion where the memory pillar MH and the conductor 51 intersect each other functions as the select transistor ST1.

A conductor 52 is provided above the upper surface of the memory pillar MH via an interlayer insulating film. The conductor 52 is formed in a line shape extending in the X direction and corresponds to the bit line BL. Although not shown, a plurality of conductors 52 are arranged in the Y direction. The conductor 52 is electrically connected to one memory pillar MH of each string unit SU.

Specifically, in each of the string units SU, for example, a conductive contact plug CP is provided on the semiconductor material 56 in the memory pillar MH, and one conductor 52 is provided on the contact plug CP. It is noted that the present disclosure is not limited to this configuration, and the memory pillar MH and the conductor may be connected via a plurality of contact plugs, wirings, or the like.

The configuration of the memory cell array 21 has been described above. It is noted that the memory cell array 21 is not limited to the above configuration. For example, any number of string units SU in each block BLK may be implemented. Further, any number of memory cells MT and select transistors ST1 and ST2 in each NAND string NS may be implemented.

Further, the numbers of the word lines WL, the select gate lines SGD, and the select gate lines SGS are changed based on the numbers of the memory cells MT, the select transistors ST1 and the select transistors ST2, respectively. A plurality of conductors 42 respectively provided in a plurality of layers may be assigned to the select gate line SGS, and a plurality of conductors 51 respectively provided in the plurality of layers may be assigned to the select gate line SGD. One NAND string NS may have a structure in which a plurality of memory pillars MH are connected in the Z direction. The memory pillar MH and the conductor 52 may be connected via a plurality of contact plugs CP or conductors.

Figure 8:
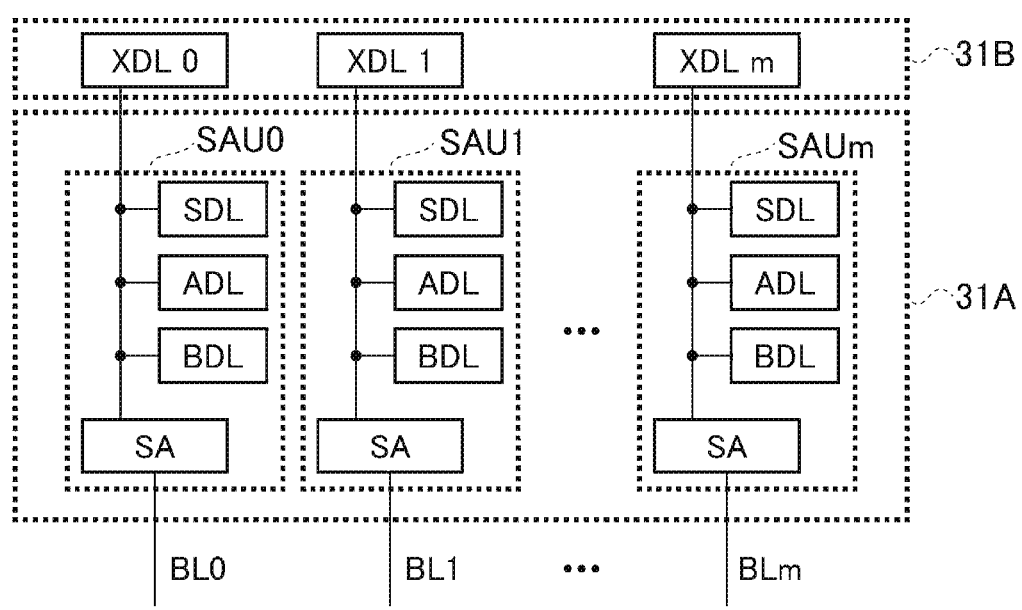
FIG. 8 is a block diagram showing a configuration of a sense amplifier.

FIG. 8 shows an example of the configuration of the sense amplifier 31. In the sense amplifier 31 shown in FIG. 8, the sense amplifier module 31A includes sense amplifier units SAU0, . . . , and SAUm. Further, the data register 31B of the sense amplifier 31 shown in FIG. 8 includes data latches XDL0, . . . , and XDLm.

The sense amplifier units SAU0, and SAUm are associated with bit lines BL0, . . . , and BLm, respectively. Further, the sense amplifier units SAU0, . . . , and SAUm are connected to the data latches XDL0, and XDLm, respectively, such that data can be transmitted and received between each other. In the following, the sense amplifier units SAU0, and SAUm are referred to as "sense amplifier unit SAU". The data latches XDL0, . . . , and XDLm are also referred to as "data latch XDL".

Each sense amplifier unit SAU includes, for example, a sense amplifier circuit SA, and latch circuits SDL, ADL, and BDL. The sense amplifier circuit SA, the latch circuits SDL, ADL, and BDL are connected such that data can be transmitted and received between each other.

For example, in the read operation, the sense amplifier circuit SA senses the read data on the corresponding bit line BL and determines whether the read data is "0" or "1". Each of the latch circuits SDL, ADL, and BDL temporarily stores read data, write data, and the like.

The data latch XDL is connected to an input/output circuit (not shown) and is used for inputting and outputting data transferred between the sense amplifier unit SAU and the input/output circuit. That is, the data latch XDL functions as, for example, a cache memory of the non-volatile memory 2.

Figure 9:
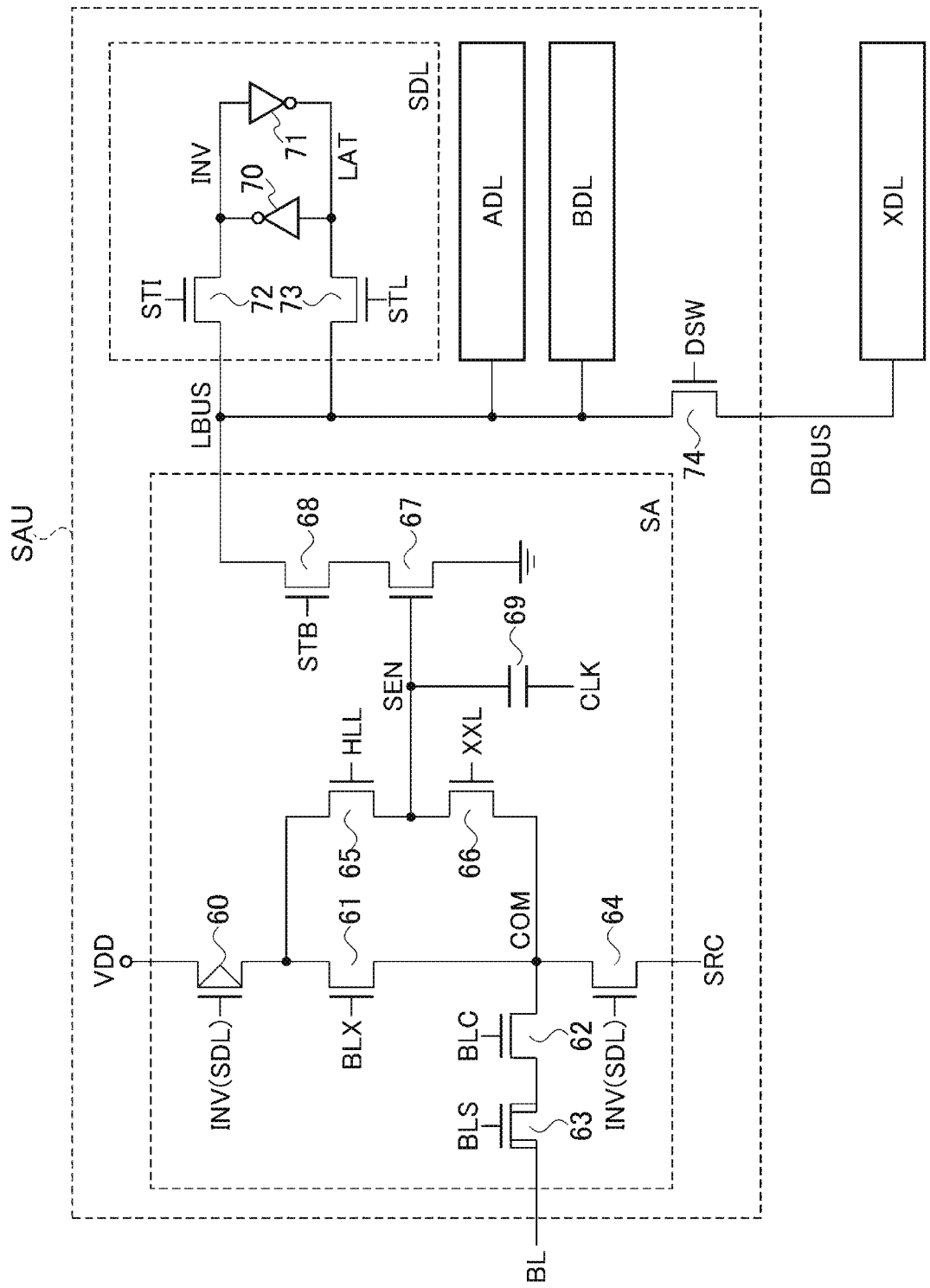
FIG. 9 is a circuit diagram showing a configuration of a sense amplifier unit and a latch circuit.

FIG. 9 shows an example of the circuit configuration of the sense amplifier circuit SA and the latch circuit SDL. As shown in FIG. 9, the sense amplifier circuit SA includes transistors 60 to 68 and a capacitor 69. The transistor 60 is a p-channel metal-oxide-semiconductor (MOS) transistor. The transistors 61 to 68 are n-channel MOS transistors. The latch circuit SDL includes inverters 70 to 71 and transistors 72 to 73. The transistors 72 to 73 are re-channel MOS transistors. The inverter 70 and the inverter 71 are connected in an antiparallel manner. That is, an output terminal of the inverter 70 and an input terminal of the inverter 71 are connected via a node INV, and an input terminal of the inverter 70 and an output terminal of the inverter 71 are connected via a node LAT. Since the circuit configurations of the latch circuits ADL and BDL, and the data latch XDL are the same as the circuit configuration of the latch circuit SDL, the description thereof will be omitted.

The sense amplifier circuit SA is configured to operate, for example, when the voltage level of the node INV of the latch circuit SDL is "L" level. It is noted that, the sense amplifier circuit SA may be configured to operate when the voltage level of the node INV of the latch circuit SDL is "H" level. Further, the sense amplifier circuit SA may refer to the voltage level of the node LAT of the latch circuit SDL.

The details of the configuration of the sense amplifier circuit SA shown in FIG. 9 will be described below. In the sense amplifier circuit SA, a first terminal of the transistor 60 is connected to the power supply line, and the gate of the transistor 60 is connected to the node INV of the latch circuit SDL. For example, the voltage VDD, which is the power supply voltage of the non-volatile memory 2, is applied to the power supply line connected to the first terminal of the transistor 60. The first terminal of the transistor 61 is connected to a second terminal of the transistor 60, a second terminal of the transistor 61 is connected to a node COM, and a control signal BLX is input to the gate of the transistor 61. As used herein, the first terminal and the second terminal of the transistor are the main electrodes of the transistor, and for example, the first terminal and the second terminal of the transistor are either a source or a drain. That is, when the first terminal is the source, the second terminal is the drain, and when the first terminal is the drain, the second terminal is the source.

A first terminal of the transistor 62 is connected to the node COM, and a control signal BLC is input to the gate of the transistor 62. The transistor 63 is, for example, a high breakdown voltage n-channel MOS transistor. A first terminal of the transistor 63 is connected to the second terminal of the transistor 62, a second terminal of the transistor 63 is connected to the corresponding bit line BL, and a control signal BLS is input to the gate of the transistor 63.

A first terminal of the transistor 64 is connected to the node COM, a second terminal of the transistor 64 is connected to a node SRC, and the gate of the transistor 64 is connected to the node INV of the latch circuit SDL. For example, a voltage VSS, which is the ground voltage of the non-volatile memory 2, is applied to the node SRC. A first terminal of the transistor 65 is connected to the second terminal of the transistor 60, a second terminal of the transistor 65 is connected to a node SEN, and a control signal HLL is input to the gate of the transistor 65.

A first terminal of the transistor 66 is connected to the node SEN, a second terminal of the transistor 66 is connected to the node COM, and a control signal XXL is input to the gate of the transistor 66. A first terminal of the transistor 67 is grounded, and the gate of the transistor 67 is connected to the node SEN.

A first terminal of the transistor 68 is connected to the second terminal of the transistor 67, a second terminal of the transistor 68 is connected to a local bus LBUS, and a control signal STB is input to the gate of the transistor 68. A first terminal of the capacitor 69 is connected to the node SEN, and a clock CLK is input to a second terminal of the capacitor 69.

Next, the details of the configuration of the latch circuit SDL shown in FIG. 9 will be described. The input terminal of the inverter 70 is connected to the node LAT, and the output terminal of the inverter 70 is connected to the node INV. The input terminal of the inverter 71 is connected to the node INV, and the output terminal of the inverter 71 is connected to the node LAT.

A first terminal of the transistor 72 is connected to the node INV, a second terminal of the transistor 72 is connected to the local bus LBUS, and a control signal STI is input to the gate of the transistor 72. A first terminal of the transistor 73 is connected to the node LAT, a second terminal of the transistor 73 is connected to the local bus LBUS, and a control signal STL is input to the gate of the transistor 73.

While the data latch XDL has the same configuration as the latch circuit SDL described above, the second terminal of the transistor 72 and the second terminal of the transistor 73 are connected to the data bus DBUS. The data latch XDL receives the data to be stored in the data latch XDL from the data bus DBUS. When data is taken into the data latch XDL, the transistor 72 is electrically connected by the control signal STI, or the transistor 73 is electrically connected by the control signal STL. Further, the data latch XDL outputs the data stored by the data latch XDL to the data bus DBUS. When data is output from the data latch XDL to the data bus DBUS, the transistor 72 is electrically connected by the control signal STI, or the transistor 73 is electrically connected by the control signal STL.

The data bus DBUS is connected to the local bus LBUS via the transistor 74. The transistor 74 is, for example, an n-channel MOS transistor. A first terminal of the transistor 74 is connected to the local bus LBUS, a second terminal is connected to the data bus DBUS, and a control signal DSW is input to the gate of the transistor 74. In response to the control signal DSW, the transistor 74 connects or disconnects the local bus LBUS and the data bus DBUS. That is, the transistor 74 connects or disconnects the sense amplifier circuit SA and the data latch XDL in response to the control signal DSW. For example, the transistor 74 functions as a switch for outputting data from a specific sense amplifier unit SAU to the data latch XDL via the data bus DBUS.

Each of the control signals BLX, BLC, BLS, HLL, XXL, and STB described above is generated by, for example, the sequencer 27. The timing at which the sense amplifier circuit SA determines the data read out to the bit line BL is based on the timing at which the control signal STB is asserted. As used herein, "asserting the control signal STB" means temporary changing the control signal STB from "L" level to "H" level by the sequencer 27. Depending on the configuration of the sense amplifier unit SAU, the operation of "asserting the control signal STB" may instead mean temporary changing the control signal STB from the "H" level to the "L" level by the sequencer 27.

It is noted that, the sense amplifier unit SAU is not limited to the configuration described above, and may be changed in various ways. For example, the number of latch circuits in the sense amplifier unit SAU may be appropriately changed based on the applied writing method.

Figure 10:
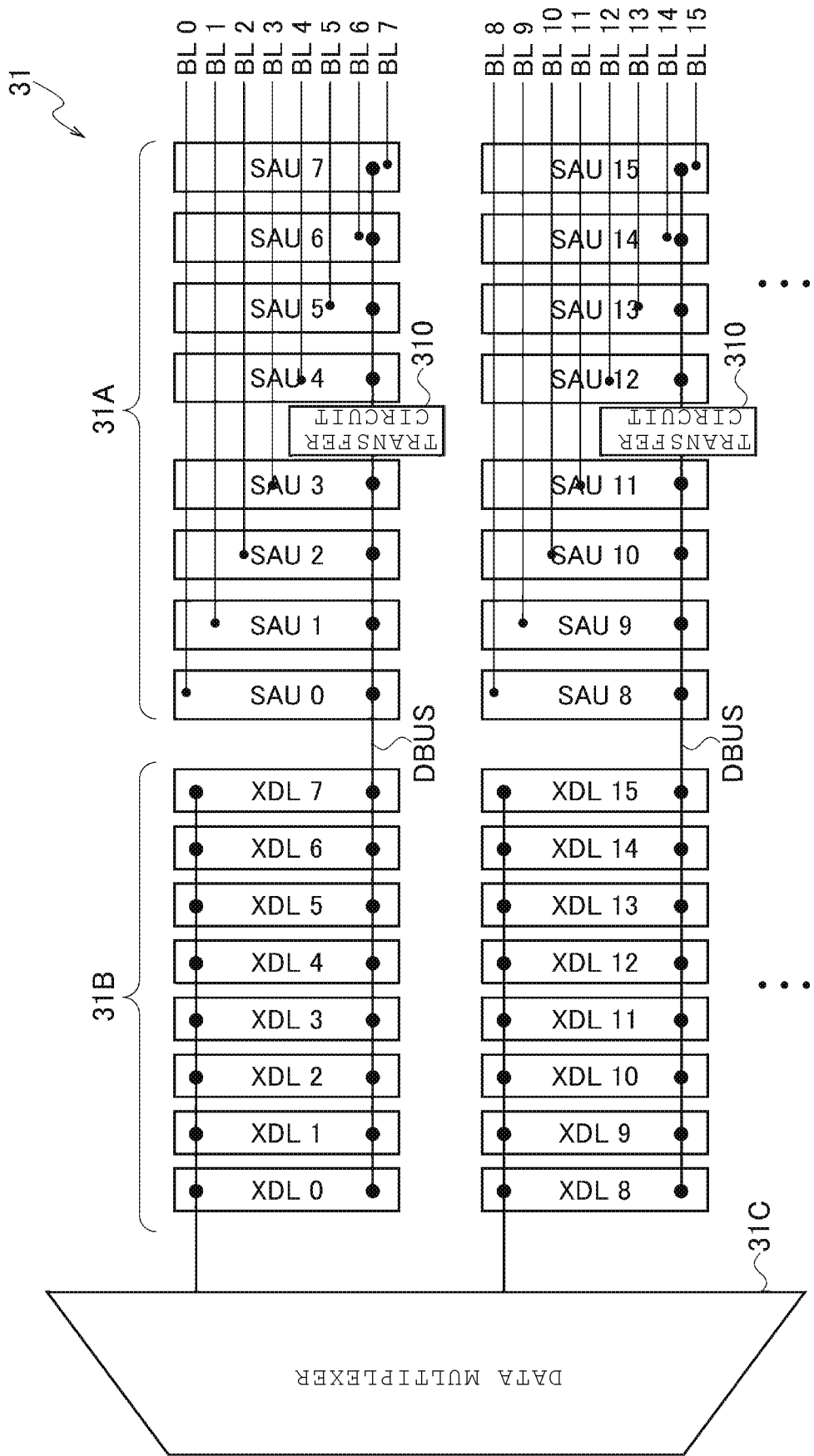
FIG. 10 is a block diagram showing an example of connection between the sense amplifier and bit lines according to the embodiment.

FIG. 10 shows the configuration of the sense amplifier 31 according to the embodiment. The sense amplifier 31 is a semiconductor integrated circuit that transmits and receives data to and from a plurality of memory cells MT associated with the word lines WL and the bit lines BL, in the non-volatile memory 2. Each of the sense amplifier modules 31A of the sense amplifier 31 shown in FIG. 10 has sense amplifier units SAU0, SAU1, . . . which are connected to the bit lines BL0, BL1, . . . , respectively. In the sense amplifier 31 shown in FIG. 10, eight sense amplifier units SAU and eight data latches XDL are connected via the data bus DBUS. A transfer circuit 310 is disposed in the data bus DBUS connecting the eight sense amplifier units SAU. Details of the transfer circuit 310 will be described later.

Figure 11:
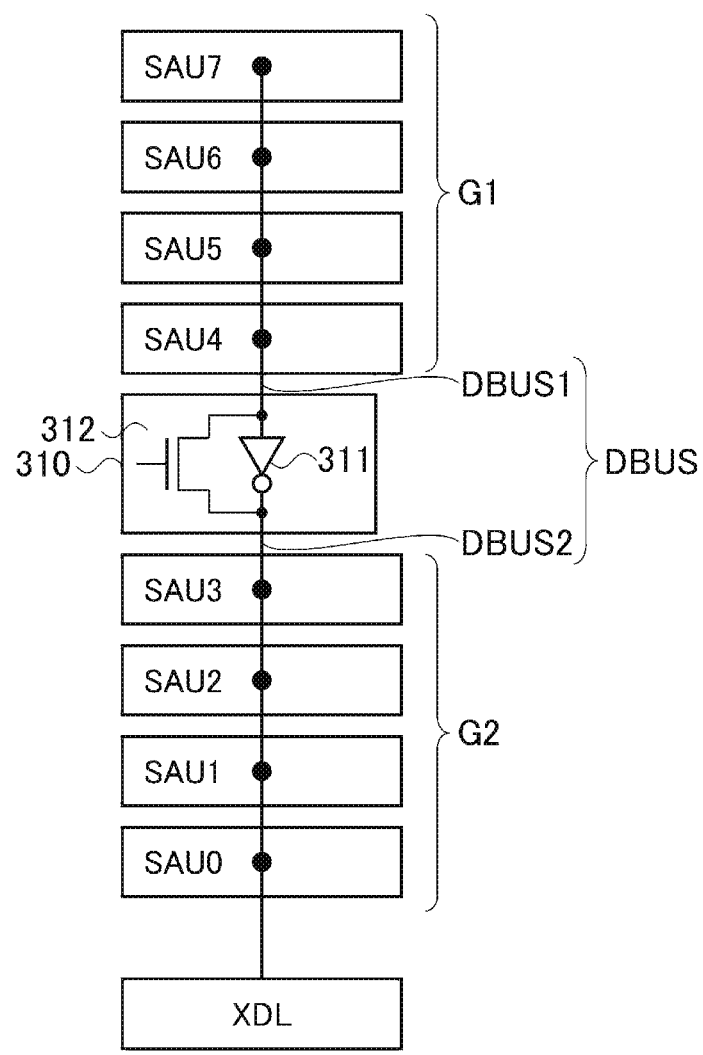
FIG. 11 is a circuit showing the configuration of the sense amplifier according to the embodiment.

FIG. 11 shows a circuit extracted from a part of the configuration of the sense amplifier 31 shown in FIG. 10. The circuit shown in FIG. 11 includes the sense amplifier unit SAU0 to SAU7 and the data latch XDL connected to the sense amplifier units SAU0 to SAU7 via the data bus DBUS. The data latch XDL shown in FIG. 11 may include, for example, eight latch circuits. The data latch XDL stores data to be transferred between the sense amplifier 31 and the memory cell MT. Hereinafter, the semiconductor integrated circuit according to the embodiment will be described with reference to the circuit shown in FIG. 11.

As shown in FIG. 11, the sense amplifier units SAU0 to SAU7, each of which is connected to one of the bit lines BL (not shown), are divided into a first group G1 including the sense amplifier units SAU4 to SAU7 and a second group G2 including the sense amplifier units SAU0 to SAU3. Hereinafter, the sense amplifier units SAU4 to SAU7 provided in the first group G1 are also referred to as "first SAU". Further, the sense amplifier units SAU0 to SAU3 provided in the second group G2 are also referred to as "second SAU".

The data bus DBUS that connects the sense amplifier units SAU0 to SAU7 and the data latch XDL includes a first data bus DBUS1 and a second data bus DBUS2. The first data bus DBUS1 is connected to each of the sense amplifier units SAU4 to SAU7 provided in the first group G1. The second data bus DBUS2 is connected to each of the sense amplifier units SAU0 to SAU3 provided in the second group G2. The data latch XDL is connected to the other end of the second data bus DBUS2. The data output from the sense amplifier units SAU0 to SAU7 to the data bus DBUS is input into the data latch XDL. It is noted that a plurality of data are not transmitted at the same time through the first data bus DBUS1 or the second data bus DBUS2.

The transfer circuit 310 is connected between one end of the first data bus DBUS1 and one end of the second data bus DBUS2. That is, the first data bus DBUS1, the transfer circuit 310, and the second data bus DBUS2 are connected in series. The transfer circuit 310 controls the transfer of data between the first data bus DBUS1 and the second data bus DBUS2 in both directions. That is, the transfer circuit 310 controls the transfer of data from the first data bus DBUS1 to the second data bus DBUS2 and the transfer of data from the second data bus DBUS2 to the first data bus DBUS1.

The transfer circuit 310 includes an inverter circuit 311 and a switch circuit 312. In the inverter circuit 311, an input terminal is connected to one end of the first data bus DBUS1, and an output terminal is connected to one end of the second data bus DBUS2. The inverter circuit 311 outputs an inverted signal of the data (which is transmitted through the first data bus DBUS1 and input to the inverter circuit 311) to the second data bus DBUS2. The switch circuit 312 is connected in parallel with the inverter circuit 311 between the one end of the first data bus DBUS1 and the one end of the second data bus DBUS2. The switch circuit 312 controls the transfer of data from the second data bus DBUS2 to the first data bus DBUS1. The switch circuit 312 is, for example, an n-channel MOS transistor.

The inverter circuit 311 transfers the read data read from the memory cell MT of the non-volatile memory 2 from the first SAU to the data latch XDL. The switch circuit 312 transfers the write data to be stored in the memory cell MT from the data latch XDL to the first SAU.

Figure 12:
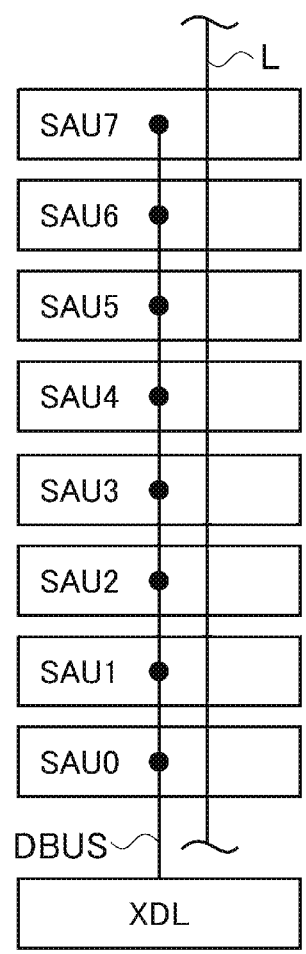
FIG. 12 is a layout showing the arrangement of wirings of a non-volatile memory of a comparative example.

In the comparative example of the non-volatile memory 2 shown in FIG. 12, another wiring L may be disposed near the data bus DBUS. The wiring L is, for example, a signal line or a power supply line. When the wiring L is a signal line, when the signal transmitted through the wiring L transitions, the data bus DBUS receives noise via the line capacitance. Similarly, when the signal transmitted through the data bus DBUS transitions, the wiring L receives noise via the line capacitance. The same applies when the wiring L is a power supply line. When there is noise in the power supply line, the data bus DBUS receives noise. When a signal transmitted through the data bus DBUS transitions, the power supply line receives noise.

When the data bus DBUS receives noise, the data transfer time between the sense amplifier unit SAU and the data latch XDL via the data bus DBUS needs to be increased in order to account for the estimated time that is needed until the noise calms down. Further, in FIG. 12, in a NAND semiconductor memory device in which there is one data bus DBUS for eight sense amplifier units SAU, for example, 16K×8 sense amplifier units SAU transition at the same time, 16K data bus DBUS is present. Therefore, when the power supply line is disposed near the data bus DBUS, the noise received by the power supply line when the signal propagating in the data bus DBUS transitions is large.

Figure 13:
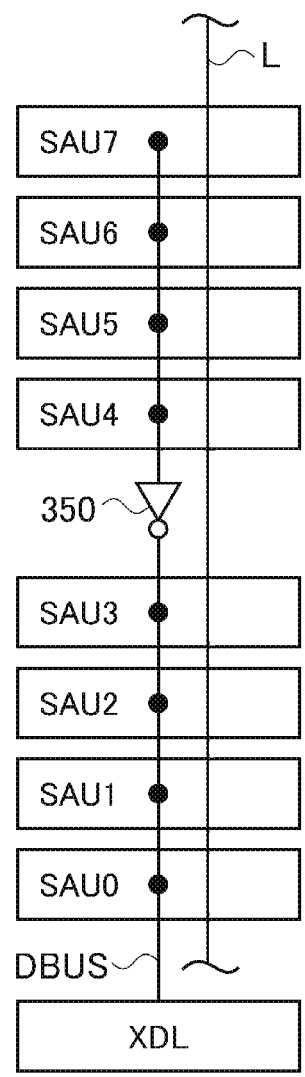
FIG. 13 is a layout showing the arrangement of wirings of a non-volatile memory of another comparative example.

As a method of solving the above problem, a method of inverting data in the data bus DBUS by the inverter circuit 350 may be considered, as illustrated in the sense amplifier of the comparative example shown in FIG. 13. According to this method, the directions of data transition in the data bus DBUS are different in the portion on the input terminal side of the inverter circuit 350 and the portion on the output terminal side of the inverter circuit 350. Therefore, while a part of the wiring L transitions according to data, the remaining part of the wiring L transitions according to the inverted signal of the data. Therefore, in the wiring L, the noise corresponding to the data and the noise corresponding to the inverted signal of the data cancel each other out. Further, even when the data bus DBUS is affected by the operation of the wiring L and noise via the wiring capacitance, since the inverter circuit 350 is provided on the data bus DBUS, the noise received by the portion on the input terminal side of the inverter circuit 350 in the data bus DBUS and the noise received by the portion on the output terminal side of the inverter circuit 350 cancel each other out. From this, it is possible to reduce both the noise that the data bus DBUS receives from the wiring L and the noise that the data bus DBUS transmits to the wiring L.

However, in the configuration shown in FIG. 13, data can be transferred from the sense amplifier unit SAU to the data latch XDL, but data cannot be transferred from the data latch XDL to the sense amplifier unit SAU.

On the other hand, in the configuration shown in FIG. 11, both the data transfer from the sense amplifier unit SAU to the data latch XDL and the data transfer from the data latch XDL to the sense amplifier unit SAU can be performed. It is noted that, although an n-channel MOS transistor is used for the switch circuit 312 in FIG. 11, a p-channel MOS transistor may be used for the switch circuit 312. In order to transfer data from the data latch XDL to the sense amplifier unit SAU, an inverter circuit that connects an input terminal to the data latch XDL, instead of a transistor, may be disposed in an antiparallel manner with the inverter circuit 311. However, the transfer circuit 310 using the two inverter circuits requires four transistors. On the other hand, by using transistors in the switch circuit 312, it is possible to configure the transfer circuit 310 with three transistors, and it is possible to reduce an increase in the area of the transfer circuit 310.

It is noted that, in the configuration shown in FIG. 11, in order to transfer data from the data latch XDL to the sense amplifier unit SAU, the data latch XDL needs to drive the data bus DBUS with a driving force exceeding the driving force of the inverter circuit 311. In other words, the driving force of the inverter circuit 311 may be weaker than the driving force of the data latch XDL. For example, the transistor in the inverter circuit 311 may have a sufficiently smaller gate channel width/channel length (W/L ratio) than the transistor of the circuit that drives the wiring in the data latch XDL.

As a method of implementing data transfer from the data latch XDL to the sense amplifier unit SAU, a configuration having a function of stopping the output may be adopted for the inverter circuit 311. Specifically, a configuration in which a switch element is connected to the output of the clocked inverter or the inverter element may be adopted for the inverter circuit 311. With such a configuration, data can be transferred from the data latch XDL to the sense amplifier unit SAU, even when the W/L ratio of the transistor of the circuit that drives the data bus DBUS of the data latch XDL is small. The inverter circuit 311 having a function of stopping the output may have, for example, the configuration shown in FIGS. 14 to 16.

Figure 14:
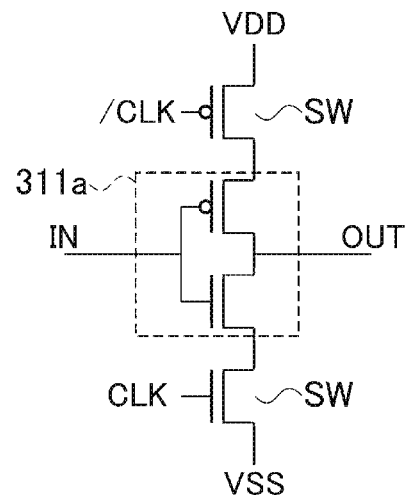
FIG. 14 is a circuit showing a configuration of an inverter circuit of the sense amplifier according to the embodiment.
Figure 15:
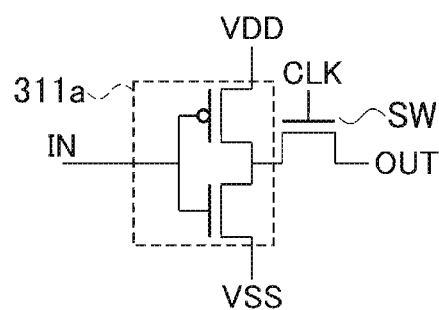
FIG. 15 is a circuit showing another configuration of the inverter circuit of the sense amplifier according to the embodiment.
Figure 16:
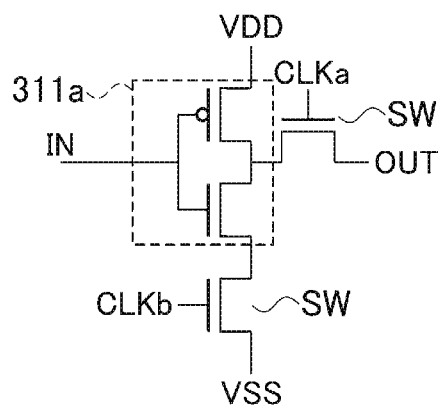
FIG. 16 is a circuit showing a still another configuration of the inverter circuit of the sense amplifier according to the embodiment.

The inverter circuits 311 shown in FIGS. 14 to 16 are circuits in which a power supply voltage is supplied from a VDD terminal and a VSS terminal, and an inverting buffer 311a and the switch unit SW are combined. The inverting buffer 311a may be composed of a complementary MOS inverter. An input terminal IN of the inverting buffer 311a is connected to the first data bus DBUS1, and an output terminal OUT of the inverting buffer 311a is connected to the second data bus DBUS2. The inverting buffer 311a may be a tri-state-type inverter, a Schmitt trigger-type inverter, or the like. When the switch unit SW is in the on state, data is transmitted from the first data bus DBUS1 to the second data bus DBUS2. When the switch unit SW is in the off state, data transmission from the first data bus DBUS1 to the second data bus DBUS2 is stopped.

The inverter circuit 311 shown in FIG. 14 is a clocked inverter. A switch unit SW of which on/off is controlled by a /CLK signal is connected between the inverting buffer 311a and the VDD terminal, and a switch unit SW of which on/off is controlled by a CLK signal is connected between the inverting buffer 311a and the VSS terminal. In the inverter circuit 311 shown in FIG. 14, when the voltage of the OUT terminal reaches the voltage of the VDD terminal or higher and the voltage of the CLK signal or higher, a through current flows between the OUT terminal and the VDD terminal.

The inverter circuit 311 shown in FIG. 15 is a circuit in which the switch unit SW is connected to the output of the inverting buffer 311a. The inverter circuit 311 shown in FIG. 15 has an advantage that a through current is not generated even if the voltage of the OUT terminal is equal to or higher than the voltage of the VDD terminal. However, when the voltage of the VDD terminal is output to the OUT terminal, the voltage passes through the n-channel MOS transistor, so that it is difficult for a large current to flow. In order to solve this problem, the voltage of the CLK signal may be higher than the voltage of the VDD terminal. That is, the gate voltage of the transistors of the switch unit SW may be higher than the power supply voltage for supplying power to the inverter circuit 311.

The inverter circuit 311 shown in FIG. 16 is a circuit in which the switch unit SW is added between the inverting buffer 311a and the VSS terminal of the circuit shown in FIG. 15. Specifically, an n-channel MOS transistor having a CLKb signal as a gate input is disposed as the switch unit SW between the inverting buffer 311a and the VSS terminal. Therefore, the switch unit SW of the n-channel MOS transistor that uses the CLKa signal as the gate input may be a transistor having a low threshold voltage. By lowering the threshold voltage of the n-channel MOS transistor that uses the CLKa signal as the gate input, the driving force when the voltage of the VDD terminal is output to the OUT terminal can be further increased. The voltage of the CLKa signal may be equal to or higher than the voltage of the VDD terminal as in the circuit shown in FIG. 15, and the driving force can be further increased.

Incidentally, when the data bus DBUS is divided as shown in FIG. 11, the data transfer time from the first SAU (sense amplifier units SAU4 to SAU7) to the data latch XDL is increased, compared with the data transfer time from the second SAU (sense amplifier units SAU0 to SAU3) disposed near the data latch XDL to the data latch XDL.

Figure 17A:
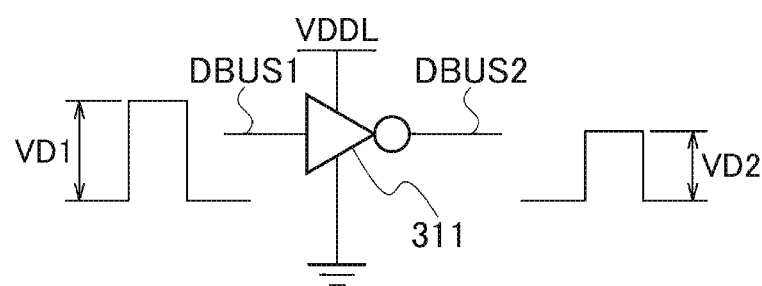
FIG. 17A is a schematic diagram illustrating a voltage amplitude of data in a data bus of the sense amplifier according to the embodiment.
Figure 17B:
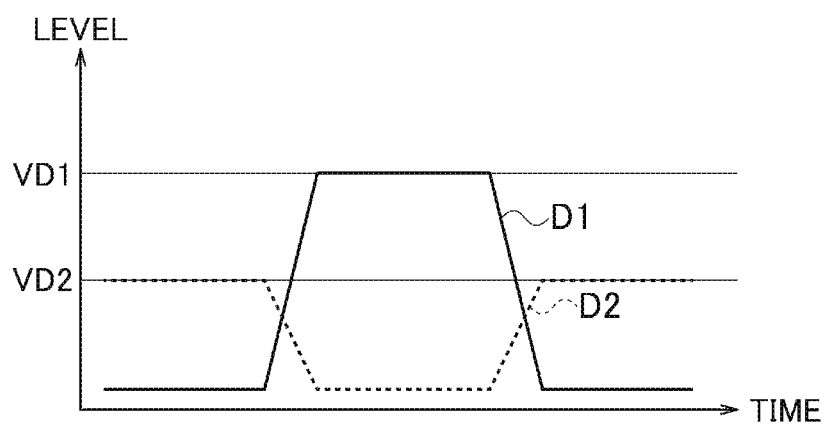
FIG. 17B is a graph illustrating the voltage amplitude of the data in the data bus of the sense amplifier according to the embodiment.

In order to shorten the data transfer time from the first SAU, for example, there is a method of adjusting the voltage amplitude of the data in the data bus DBUS as follows. That is, the voltage amplitude of the data in the first data bus DBUS1 when the data is output from the first SAU (sense amplifier units SAU4 to SAU7) to the first data bus DBUS1 is made larger than the voltage amplitude of the data in the second data bus DBUS2 when the data is output from the second SAU (sense amplifier units SAU0 to SAU3) to the second data bus DBUS2. By increasing the voltage amplitude of the data transmitted through the first data bus DBUS1, the gate voltage of the inverting buffer 311a of the inverter circuit 311 becomes large. As a result, the driving force of the inverting buffer 311a is increased, and the time required for transmitting data on the second data bus DBUS2 can be shortened. For example, as shown in FIGS. 17A and 17B, the voltage amplitude VD1 of the data D1 propagating in the first data bus DBUS1 is made larger than the voltage amplitude VD2 of the data D2 propagating in the second data bus DBUS2. The voltage amplitude VD2 is equivalent to the power supply voltage VDDL that drives the inverter circuit 311. As described above, in order to shorten the data transfer time from the first SAU, the voltage amplitude of the input terminal of the Inverting buffer 311a may be made larger than the power supply voltage for supplying power to the inverter circuit 311.

Further, when the switch unit SW for stopping the output of the inverting buffer 311a is provided in the inverter circuit 311, the gate voltage of the transistor of the switch unit SW may be different from the power supply voltage for supplying power to the inverter circuit 311. For example, the gate voltage of the transistor of the switch unit SW may be higher than the power supply voltage of the inverter circuit 311. Further, the gate voltage of the transistor of the switch unit SW may be larger than the voltage amplitude of the input terminal of the inverting buffer 311a. When the switch unit SW is composed of an re-channel MOS transistor, the on resistance of the switch unit SW can be lowered by increasing the gate voltage of the transistor, and high-speed operation can be performed. Further, when the switch unit SW is composed of a p-channel MOS transistor, if the gate voltage during off time is made higher than the power supply voltage, even a p-channel MOS transistor having a low threshold voltage can be turned off. Therefore, the on resistance of the switch unit SW can be reduced to implement high-speed operation. In this way, the threshold voltage of the transistor of the switch unit SW may be lower than the threshold voltage of the transistor of the inverting buffer 311a.

With the sense amplifier 31 having the transfer circuit 310 shown in FIG. 11, it is possible to achieve a high-speed data transfer operation from the sense amplifier unit SAU to the data latch XDL. The data bus DBUS is divided into the first data bus DBUS1 and the second data bus DBUS2 by the switch circuit 312. When data is transferred from the second group G2 (sense amplifier units SAU0 to SAU3) to the data latch XDL, only the wiring capacitance of the second data bus DBUS2 need to be charged. Similarly, when data is output from the first group G1 (sense amplifier units SAU4 to SAU7), only the wiring capacitance of the first data bus DBUS1 need to be charged. Since the inverting buffer 311a is provided in the middle of the data bus DBUS to divide the data bus DBUS, the RC delay of the wiring to be charged in each data transfer operation is shortened, so that the operation speed can be increased.

For example, the case is considered where the inverting buffer 311a is disposed near the center of the data bus DBUS in the extending direction. In this case, if the capacitance of the data latch XDL and the wiring capacitance on the data latch XDL are ignored for the sake of simplicity, the wiring resistance and the wiring capacitance of the first data bus DBUS1 and the second data bus DBUS2 are equivalent. Assuming that the wiring resistance and the wiring capacitance at this time are R and C, the delay times of the first data bus DBUS1 and the second data bus DBUS2 are RC, and the combined delay time of the first data bus DBUS1 and the second data bus DBUS2 is 2RC. On the other hand, when the data bus DBUS is not divided, the wiring resistance and the capacitance are 2R and 2C, so that the delay time is 2R×2C=4RC. That is, by locating the inverting buffer 311a in the data bus DBUS, the data transfer speed from the first group G1 can be doubled.

When the data bus DBUS is not divided, the time required to transfer data from both the first group G1 and the second group G2 is the sum of the time 4RC required to transfer data from the first group G1 and the time required to transfer data from the second group G2. The time required to transfer data from the second group G2 is the RC of the RC product of the second data bus DBUS2. Therefore, the time required to transfer data from both the first group G1 and the second group G2 is 4RC+1RC=5RC. At this time, the first group G1 transfers data from the sense amplifier unit SAU7 farthest from the data latch XDL, and the second group G2 also transfers data from the sense amplifier unit SAU3 farthest from the data latch XDL. When the data bus DBUS is divided, the time required to transfer data from both the first group G1 and the second group G2 is 3RC, which is the sum of the time 2RC required to transfer data from the first group G1 and the time 1RC required to transfer data from the second group G2. In this way, as opposed to the case where the data bus DBUS is not divided, when the data bus DBUS is divided, the data transfer speed when the data is transferred bit by bit from both the first group G1 and the second group G2 is 5RC/3RC=5/3, and a speed increase of about 1.67 times can be achieved.

Further, the first data bus DBUS1 is not used during the period in which the data output from the second group G2 is transferred to the data latch XDL via the second data bus DBUS2. Therefore, it is possible to output data from the first group G1 to the first data bus DBUS1 during the period when the data is output from the second group G2 to the data latch XDL via the second data bus DBUS2. Since the data transfer from the second group G2 (sense amplifier units SAU0 to SAU3) to the second data bus DBUS2 and the data transfer from the first group G1 (sense amplifier units SAU4 to SAU7) to the first data bus DBUS1 can be performed at the same time, it is possible to further speed up the entire data output operation. That is, a timing at which a switch is electrically connected in order for one of the sense amplifier units SAU in the first group G1 to output data to the data bus DBUS1 and a timing at which a switch is electrically connected in order for one of the sense amplifier units SAU in the second group G2 to output data to the data bus DBUS2 may at least partially overlap. The switch for outputting data to the data bus DBUS1 or DBUS2 is, for example, the transistor 74 shown in FIG. 9. The data transfer delay time when data is output from the first group G1 and the second group G2 at the same time is 2RC, which is the sum of: 1RC when the data is written from the second group G2 to the data latch XDL via the second data bus DBUS2, and 1RC when the data of the first group G1 is written to the data latch XDL via the second data bus DBUS2 from the state where the data has already been output to the first data bus DBUS1. Thus, a speed increase of 5RC/2RC=2.5 times can be achieved as compared with the case where the data bus DBUS is not divided.

As described above, the timing at which the first SAU provided in the first group G1 outputs data to the first data bus DBUS1 and the timing at which the second SAU provided in the second group G2 outputs data to the second data bus DBUS2 may overlap. Since the timing at which the first SAU outputs data and the timing at which the second SAU outputs data overlap, the speed can be twice as fast as the speed when the output of data from the second SAU and the output of data from the first SAU are performed at different timings.

An operation example of the circuit shown in FIG. 11 will be described below with reference to FIG. 18. In the following operation example, the sense amplifier units SAU provided in the first group G1 and the sense amplifier units SAU provided in the second group G2 simultaneously read data from the memory cell MT.

Figure 18:
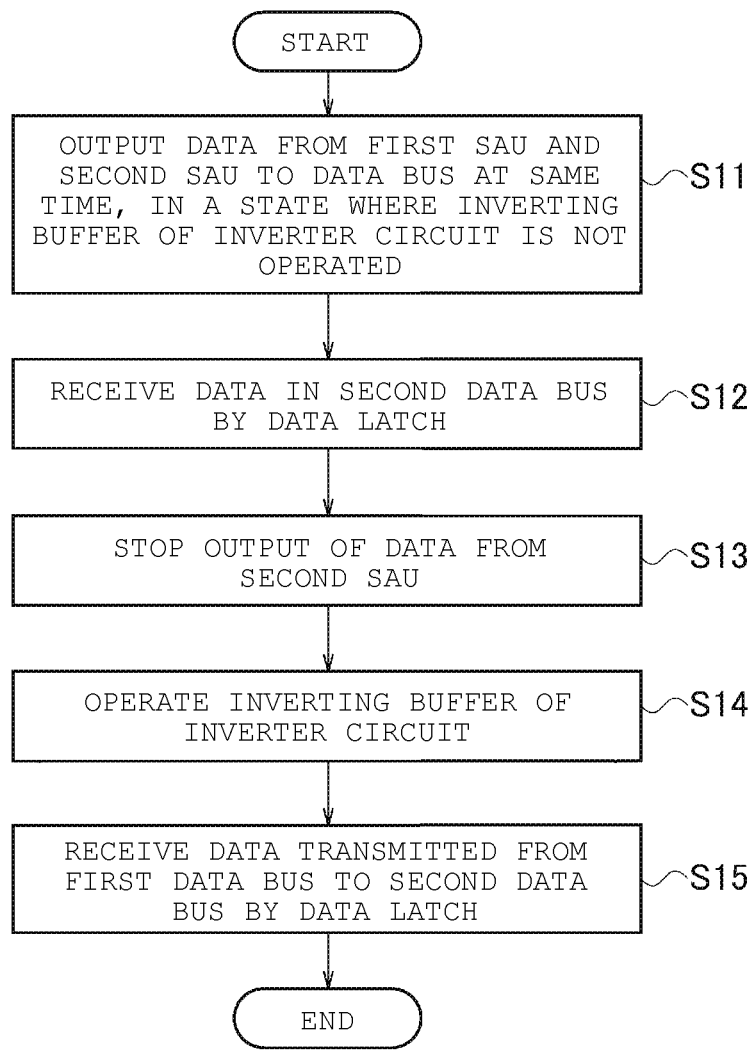
FIG. 18 is a flowchart illustrating an operation example of the sense amplifier according to the embodiment.

First, in step S11 of FIG. 18, data is output from the first SAU and the second SAU to the data bus DBUS at the same time, in a state in which the inverting buffer 311a of the inverter circuit 311 is not operated. That is, data is output from one sense amplifier unit SAU provided in the first group G1 to the first data bus DBUS1, and data is output from one sense amplifier unit SAU provided in the second group G2 to the second data bus DBUS2. Here, the state in which the inverting buffer 311a is not operated is, for example, a state in which the switch unit SW of the inverter circuit 311 is off and data transmitted from the first data bus DBUS1 to the second data bus DBUS2 is stopped.

In step S12, the data output from the second SAU to the second data bus DBUS2 is received by the data latch XDL. After that, in step S13, the output of data from the second SAU to the second data bus DBUS2 is stopped.

In step S14, the inverting buffer 311a of the inverter circuit 311 is operated. Here, operating the inverting buffer 311a means that, for example, the switch unit SW of the inverter circuit 311 is in the on state, and the transmission of data from the first data bus DBUS1 to the second data bus DBUS2 is not stopped. By operating the inverting buffer 311a, the data that is output from the first SAU to the first data bus DBUS1 is inverted in the transfer circuit 310 and transmitted to the second data bus DBUS2. Then, in step S15, the data transmitted from the first data bus DBUS1 to the second data bus DBUS2 is received by the data latch XDL.

As described above, the sense amplifier units SAU provided in the first group G1 and the sense amplifier units SAU provided in the second group G2 transfer data to the data latch XDL at different timings.

In FIG. 18, an operation example of outputting data from the first SAU and the second SAU to the data bus DBUS at the same time is described. However, if the output of data from the first SAU to the first data bus DBUS1 is completed before the inverting buffer 311a is operated, even if the output of data from the first SAU and the output of data from the second SAU are not simultaneously performed, the operation time is not affected. An operation example when the output of data from the first SAU to the data bus DBUS and the output of data from the second SAU to the data bus DBUS are not simultaneously performed will be described with reference to FIG. 19.

In step S21 of FIG. 19, data is output from the second SAU to the data bus DBUS, in a state in which the inverting buffer 311a of the inverter circuit 311 is not operated. In step S22, data is output from the first SAU to the data bus DBUS, in a state in which the inverting buffer 311a is not operated.

Then, in the same manner as in steps S12 to S15 described with reference to FIG. 18, the data output from the first SAU and the second SAU, respectively, is received by the data latch XDL. That is, after the data that is output from the second SAU to the second data bus DBUS2 is input into the data latch XDL, the inverting buffer 311a is operated. Then, the data that is output from the first SAU to the first data bus DBUS1 is inverted in the transfer circuit 310 and is received by the data latch XDL.

In the operation example described with reference to FIG. 19, after the data is output from the second SAU to the second data bus DBUS2, the data is output from the first SAU to the first data bus DBUS1. At this time, until the data latch XDL receives the data output to the second data bus DBUS2 and the output of the data from the second SAU to the second data bus DBUS2 is stopped, the data is output from the first SAU to the first data bus DBUS1.

That is, before operating the inverting buffer 311a, a time for the data latch XDL to receive the data in the second data bus DBUS2 and a time to stop the output of the data from the second SAU are required. Therefore, the start time of the output of data from the first SAU may be delayed as a result of the data output operation from the second SAU. Therefore, the timing at which the peak current is generated due to the operation of the sense amplifier unit SAU can be shifted between the data output operation from the first SAU and the data output operation from the second SAU. By shifting the timing at which the peak current is generated, it is possible to reduce the noise generated by the operation of the sense amplifier unit SAU.

Figure 20A:
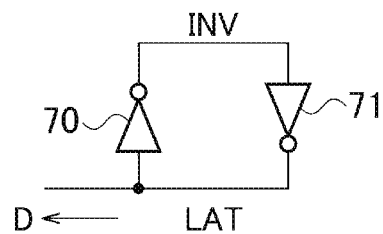
FIG. 20A is a circuit diagram illustrating a method of outputting data from the sense amplifier unit of the sense amplifier according to the embodiment.
Figure 20B:
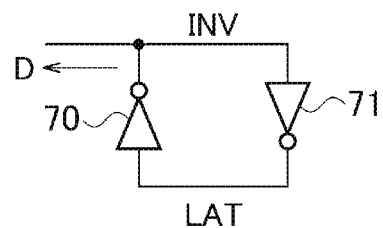
FIG. 20B is a circuit diagram illustrating another method of outputting the data from the sense amplifier unit of the sense amplifier according to the embodiment.

In the operation examples described with reference to FIGS. 18 and 19, the data output from the first SAU is inverted in the transfer circuit 310 and then transferred to the data latch XDL. Therefore, in order to positively and negatively match the data output from the first SAU with the data output from the second SAU, the data output from the first SAU may be inverted with respect to the data output from the second SAU. That is, the first SAU may invert and output the stored data, and the second SAU may output the stored data without inversion. For example, when data is output from the latch circuit SDL in which the inverter 70 and the inverter 71 shown in FIG. 9 are configured in an antiparallel manner, the transistor 73 is electrically connected in the second SAU, whereas the transistor 72 is electrically connected in the first SAU. That is, when the data D is output from the second SAU, the transistor 72 may be turned off, the transistor 73 may be turned on, and the data D may be output from the LAT terminal as shown in FIG. 20A. Then, when the data D is output from the first SAU, the transistor 72 may be turned on, the transistor 73 may be turned off, and the data D may be output from the INV terminal as shown in FIG. 20B.

As described above, the data may be output from different terminals of the latch circuit, depending on whether the data is output from the first SAU or the second SAU. Thus, the data output from the first SAU and the data output from the second SAU can be matched positively and negatively.

Figure 21A:
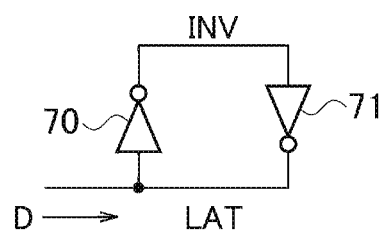
FIG. 21A is a circuit diagram illustrating a method in which the data latch of the sense amplifier according to the embodiment stores data.
Figure 21B:
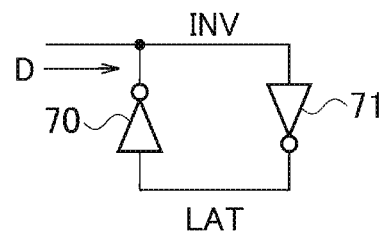
FIG. 21B is a circuit diagram illustrating another method in which the data latch of the sense amplifier according to the embodiment stores data.

Alternatively, when the data latch XDL receives the data output from the first SAU, the data latch XDL may invert and store the data. For example, when the data latch XDL has the same circuit configuration as the latch circuit SDL shown in FIG. 9, the data latch XDL stores data in a latch circuit in which the inverter 70 and the inverter 71 are configured in antiparallel. In this case, the electrically connected states of the transistor 72 and the transistor 73 may be reversed, depending on whether the data latch XDL stores the data output from the first SAU or the data output from the second SAU. That is, when the data latch XDL receives the data D output from the second SAU, the transistor 72 is turned off, the transistor 73 is turned on, and the data D may be input to the LAT terminal of the latch circuit as shown in FIG. 21A. Then, when the data latch XDL receives the data D output from the first SAU, the transistor 72 is turned on, the transistor 73 is turned off, and the data D may be input to the INV terminal as shown in FIG. 21B.

As described above, the data latch XDL may receive data from different terminals of the latch circuit of the data latch XDL, depending on whether the data is output from the first SAU or the second SAU. Thus, the data output from the first SAU and the data output from the second SAU can be matched positively and negatively.

In the above, the case of the read operation of the non-volatile memory 2 is described. In the write operation of the non-volatile memory 2, the switch circuit 312 may be electrically connected in a state where the inverting buffer 311*a* is not operated, and data may be input to the sense amplifier unit SAU. Since the write operation is not required to be as fast as the read operation, the influence of noise can be mitigated by reducing the operating speed.

It is noted that, when the data bus DBUS is divided as shown in FIG. 11, it is possible to output data from the first SAU to the first data bus DBUS1, during the period when data is input from the data latch XDL to the second SAU via the second data bus DBUS2. By operating the first SAU and the second SAU at the same time in this way, it is possible to speed up a series of operations including input of data to the sense amplifier unit SAU and output of data from the sense amplifier unit SAU.

Further, by dividing the data bus DBUS into the first data bus DBUS1 and the second data bus DBUS2, the wiring capacitance of the second data bus DBUS2 is smaller than that in the case where the first data bus DBUS1 and the second data bus DBUS2 are continuous. Therefore, the data transfer on the second data bus DBUS2 can be performed at a higher speed than the data transfer on the first data bus DBUS1. In order to take advantage of this feature, an operation of outputting data only from the second SAU (first read operation), an operation of outputting data only from the first SAU (second read operation), and an operation of outputting data from the first SAU and the second SAU (third read operation) may be set. Then, the first to third read operations may be used properly according to the intended use. For example, data that needs to be read at high speed may be stored in the memory cell corresponding to the second SAU, and data that does not need to be read at high speed may be stored in the memory cell corresponding to the first SAU. Further, it is possible to select two operations according to the application, assuming three cases including a case of a read operation only by the first SAU, a case of a read operation only by the second SAU, and a case of a read operation by the first SAU and the second SAU.

By distinguishing the first to third read operations by external commands and instructing the non-volatile memory 2, the number of external commands may be reduced. For example, an external command for instructing a first read operation of outputting data only from the second SAU is used as a high-speed read command. Then, an external command for instructing a second read operation of outputting data only from the first SAU is used as a low-speed read command. As described above, an instruction to cause the first SAU to read the data from the memory cell and an instruction to cause the second SAU to read the data from the memory cell may be different.

Alternatively, in the non-volatile memory 2 that supports only the first read operation and the second read operation, the first read operation and the second read operation may be distinguished by an address instead of an external command. For example, a high-speed read operation may be executed by a read instruction for a specific address associated with the bit line BL connected to the second SAU. That is, in the operation of reading data from the memory cell, in the case of the relatively high-speed read operation, the address corresponding to the memory cell associated with the bit line BL to be connected to the second SAU is specified by the read instruction. Then, in the case of a relatively low-speed read operation, the address corresponding to the memory cell associated with the bit line BL connected to the first SAU is specified by the read instruction.

For example, the non-volatile memory 2 has a configuration in which the number of sense amplifier units SAU operating simultaneously as a whole corresponds to 16 kB. In this case, when the data bus DBUS is divided into the first data bus DBUS1 and the second data bus DBUS2 such that the number of the first SAUs and the number of the second SAUs are equal, the respective numbers of the first SAU and the second SAU correspond to 8 kB. Therefore, the read operation of only 8 kB data corresponding to the first read operation or the second read operation and the read operation of 16 kB data corresponding to the third read operation may be executed depending on the application.

Incidentally, in the configuration of a general NAND flash memory, the sense amplifier unit SAU is connected to the bit line BL on a one-to-one basis. In addition, data is read out from all the bit lines BL at the same time. In such a configuration, by alternately locating the bit line BL connected to the first SAU and the bit line BL connected to the second SAU, the operation speed can be increased as follows.

For example, when data is transmitted only to the bit line BL connected to the first SAU as the read target bit line BL, the voltage of the bit line BL connected to the second SAU is fixed at a constant voltage. When the voltage of the bit line BL connected to the second SAU is fixed to a constant voltage, the bit line BL having a fixed voltage is present on both sides of the bit line BL connected to the first SAU. Since the bit line BL having a fixed voltage functions as a shield line, the noise received by the bit line BL connected to the first SAU is reduced. On the other hand, when data is transmitted only to the bit line BL connected to the second SAU as the read target bit line BL, the voltage of the bit line BL connected to the first SAU disposed on both sides of the bit line BL connected to the second SAU is fixed at a constant voltage. This reduces the noise received by the bit line BL connected to the second SAU.

It is noted that, the voltage of the bit line BL fixed at a constant voltage may be, for example, the source voltage of the NAND string NS. When the voltage of the bit line BL is fixed to the source voltage of the NAND string NS, no current flows through the NAND string NS. However, the voltage of the connected bit line BL fixed to a constant voltage may be another voltage.

Since the voltage of the read target bit line BL changes during the read operation, it affects the data transfer in the bit line BL close to the read target bit line BL. However, by fixing the voltage of the bit line BL close to the read target bit line BL, the bit line BL close to the read target bit line BL is not affected by the change in the voltage of the read target bit line BL. Therefore, high-speed operation is possible by alternately locating the bit line BL connected to the first SAU and the bit line BL connected to the second SAU.

Figure 22:
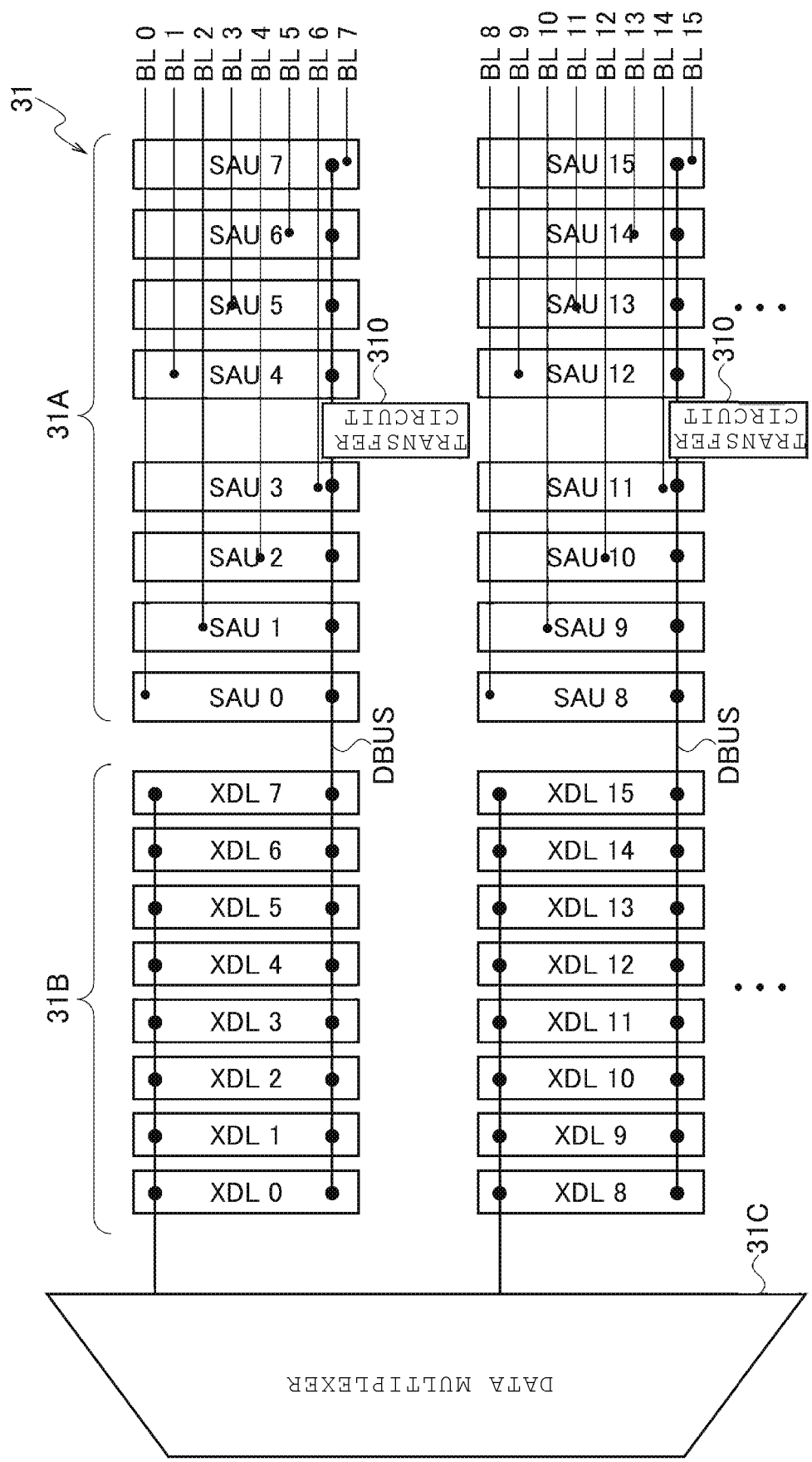
FIG. 22 is a block diagram showing another example of connection between the sense amplifier and bit lines according to the embodiment.

FIG. 22 shows an example in which the bit lines BL connected to the first SAUs and the bit lines BL connected to the second SAUs are alternately arranged. In FIG. 22, the sense amplifier units SAU4 to SAU7 are the first SAUs, and the sense amplifier units SAU0 to SAU3 are the second SAUs. Further, the sense amplifier units SAU12 to SAU15 are the first SAUs, and the sense amplifier units SAU8 to SAU11 are the second SAUs. The bit lines BL connected to the second SAUs are disposed on both sides of the bit lines BL connected to the first SAUs. The bit lines BL connected to the first SAUs are disposed on both sides of the bit lines BL connected to the second SAUs.

OTHER EMBODIMENTS

In the above description, the case where the non-volatile memory 2 is a NAND flash memory is described, but the non-volatile memory 2 may be another type of memory device. Further, in the embodiment of the present disclosure, a semiconductor memory device other than the non-volatile memory may be used.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor integrated circuit configured to transmit and receive data to and from a plurality of memory cells associated with word lines and bit lines in a semiconductor memory device, the semiconductor integrated circuit comprising:
   a plurality of sense amplifier units, including a first group of sense amplifier units and a second group of sense amplifier units, wherein each of the sense amplifier units is connected to one of the bit lines;
   a first data bus connected to each of the sense amplifier units in the first group;
   a second data bus connected to each of the sense amplifier units in the second group;
   a transfer circuit that is connected between the first data bus and the second data bus and controlled to invert and transfer data in a first direction from the first data bus to the second data bus and to transfer data in a second direction from the second data bus to the first data bus without inversion, the transfer circuit including an inverter circuit that is connected between the first data bus and the second data bus and is controlled to enable transmission of data from the first data bus to the second data bus therethrough during the data transfer in the first direction and to block the transmission of data from the first data bus to the second data bus therethrough during the data transfer in the second direction; and
   a data latch that is connected to the second data bus, and to the first data bus through the second data bus and the transfer circuit.

2. The semiconductor integrated circuit according to claim 1, wherein the transfer circuit further includes
   a first switch circuit that is connected in parallel with the inverter circuit between the first data bus and the second data bus, and is controlled to block the transmission of data therethrough during the data transfer in the first direction and to enable the transmission of data therethrough during the data transfer in the second direction.

3. The semiconductor integrated circuit according to claim 2, wherein the inverter circuit includes
   an inverting buffer having an input terminal connected to the first data bus and an output terminal connected to the second data bus, and
   a second switch circuit that is controlled to enable transmission of data from the first data bus to the second data bus through the inverting buffer during the data transfer in the first direction and to block the transmission of data from the first data bus to the second data bus through the inverting buffer during the data transfer in the second direction.

4. The semiconductor integrated circuit according to claim 3, wherein the second switch circuit includes a MOS transistor, and
   a gate voltage of the MOS transistor is higher than a power supply voltage that is supplied to the inverter circuit.

5. The semiconductor integrated circuit according to claim 3, wherein
   the inverting buffer includes a complementary MOS inverter, and a voltage amplitude at the input terminal of the inverting buffer is larger than a power supply voltage that is supplied to the inverter circuit.

6. The semiconductor integrated circuit according to claim 3, wherein
the inverting buffer includes a complementary MOS inverter, and
a gate voltage of a MOS transistor of the second switch circuit is larger than a voltage amplitude at the input terminal of the inverting buffer.

7. The semiconductor integrated circuit according to claim 3, wherein
a threshold voltage of a MOS transistor of the second switch circuit is lower than a threshold voltage of a MOS transistor of the inverting buffer.

8. The semiconductor integrated circuit according to claim 1, wherein, during an operation that includes data transmission through the first data bus and the second data bus,
a voltage amplitude of data transmitted through the first data bus is larger than a voltage amplitude of data transmitted through the second data bus.

9. The semiconductor integrated circuit according to claim 1, wherein, during an operation that includes data transmission through the first data bus and the second data bus,
the sense amplifier units in the first group and the sense amplifier units in the second group simultaneously read the data from the memory cells of the plurality of memory cells that are respective thereto, and
the data read by the sense amplifier units in the first group and the data read by the sense amplifier units in the second group are transferred to the data latch at different timings.

10. The semiconductor integrated circuit according to claim 9, wherein, during the operation that includes data transmission through the first data bus and the second data bus,
a time period during which the sense amplifier units in the first group output the data to the first data bus and a time period during which the sense amplifier units in the second group output the data to the second data bus at least partially overlap.

11. The semiconductor integrated circuit according to claim 9, wherein, during the operation that includes data transmission through the first data bus and the second data bus,
after the data has been output from the sense amplifier units in the second group to the second data bus, the data is output from the sense amplifier units in the first group to the first data bus.

12. The semiconductor integrated circuit according to claim 1, wherein, during an operation that includes data transmission through the first data bus and the second data bus,
the sense amplifier units in the first group output data after inversion, and
the sense amplifier units in the second group output data without inversion.

13. The semiconductor integrated circuit according to claim 1, wherein
the sense amplifier units in the first and second groups each include a latch circuit having a first terminal and a second terminal, and
each of the sense amplifier units in the first group outputs data through the first terminal of the latch circuit corresponding thereto and each of the sense amplifier units in the second group outputs data through the second terminal of the latch circuit corresponding thereto.

14. The semiconductor integrated circuit according to claim 1, wherein
the data latch includes a latch circuit including first and second terminals, and
the data output from the sense amplifier units in the first group is received at the first terminal and the data output from the sense amplifier units in the second group is received at the second terminal.

15. The semiconductor integrated circuit according to claim 1, wherein, during an operation that includes data transmission through the first data bus and the second data bus,
the data is output from the sense amplifier units in the first group to the first data bus, during a period in which the data is transmitted from the data latch to the sense amplifier units in the second group via the second data bus.

16. The semiconductor integrated circuit according to claim 1, wherein
an instruction to cause the sense amplifier units in the first group to read the data from the memory cells of the plurality of memory cells that are respective thereto is different from an instruction to cause the sense amplifier units in the second group to read the data from the memory cells of the plurality of memory cells that are respective thereto.

17. The semiconductor integrated circuit according to claim 16, wherein
in a case of a first read operation, addresses corresponding to the memory cells of the plurality of the memory cells associated with a group of the bit lines that are connected to the sense amplifier units in the second group are designated by a first read instruction, and
in a case of a second read operation that is slower than the first read operation, addresses corresponding to the memory cells of the plurality of the memory cells associated with a group of the bit lines that are connected to the sense amplifier units in the first group are designated by a second read instruction.

18. The semiconductor integrated circuit according to claim 1, wherein
the bit lines connected to the sense amplifier units in the first group and the bit lines connected to the sense amplifier units in the second group are alternately arranged.

19. A method of transmitting data from a plurality of sense amplifier units of a semiconductor integrated circuit to a data latch of the semiconductor integrated circuit over a first data bus that is connected to a first group of the sense amplifier units and a second data bus that is connected to a second group of the sense amplifier units, said method comprising:
controlling a transfer circuit that is connected between the first data bus and the second data bus to invert and transfer data in a first direction from the first data bus to the second bus and to transfer data in a second direction from the second data bus to the first data bus without inversion,
wherein the transfer circuit includes an inverter circuit that is connected between the first data bus and the second data bus and is controlled to enable transmission of data from the first data bus to the second data bus therethrough during the data transfer in the first direction and to block the transmission of data from the first data bus to the second data bus therethrough during the data transfer in the second direction.

20. The method according to claim 19, wherein the transfer circuit includes
a switch circuit that is connected in parallel with the inverter circuit between the first data bus and the second data bus, and is controlled to be turned off when transferring data from the sense amplifier units in the first group to the data latch through the first data bus and the second data bus, and to be turned on when transferring data from the data latch to the sense amplifier units in the first group through the second data bus and the first data bus.

* * * * *